United States Patent [19]

Kimura et al.

[11] Patent Number: 5,583,358
[45] Date of Patent: Dec. 10, 1996

[54] SEMICONDUCTOR MEMORY DEVICE HAVING STACKED CAPACITORS

[75] Inventors: Shinichiro Kimura; Naotaka Hashimoto, both of Hachioji; Yoshio Sakai, Tsukui-gun; Tokuo Kure, Nishitama-gun; Yoshifumi Kawamoto, Tsukui-gun; Toru Kaga, Urawa; Eiji Takeda, Koganei, all of Japan

[73] Assignee: Hitachi, Ltd., Tokyo, Japan

[21] Appl. No.: 324,352

[22] Filed: Oct. 17, 1994

Related U.S. Application Data

[63] Continuation of Ser. No. 72,482, Jun. 3, 1993, Pat. No. 5,374,576, which is a continuation of Ser. No. 805,383, Dec. 10, 1991, abandoned, which is a division of Ser. No. 475,148, Feb. 5, 1990, Pat. No. 5,140,389, which is a continuation-in-part of Ser. No. 287,881, Dec. 21, 1988, Pat. No. 4,970,564.

[30] Foreign Application Priority Data

Jan. 8, 1988 [JP] Japan .................. 63-1213
Feb. 28, 1989 [JP] Japan .................. 1-045400
Feb. 28, 1989 [JP] Japan .................. 1-045401

[51] Int. Cl.⁶ ............................. H01L 27/108
[52] U.S. Cl. .......................... 257/306; 257/296
[58] Field of Search ................................ 257/306

[56] References Cited

U.S. PATENT DOCUMENTS

| | | | |
|---|---|---|---|
| 4,151,607 | 4/1979 | Koyanagi et al. | 257/296 |
| 4,309,812 | 1/1982 | Horng et al. | 437/31 |
| 4,355,374 | 10/1982 | Sakai et al. | 257/306 |
| 4,475,118 | 10/1984 | Klein et al. | 257/306 |
| 4,583,281 | 4/1986 | Ghezzo et al. | 437/62 |
| 4,649,406 | 3/1987 | Takemae et al. | 257/306 |
| 4,651,183 | 3/1987 | Lange et al. | 257/296 |
| 4,742,018 | 5/1988 | Kimura et al. | 365/149 |
| 4,754,313 | 6/1988 | Takemae et al. | 257/306 |
| 4,794,563 | 12/1988 | Maeda | 257/303 |
| 4,871,688 | 5/1988 | Lowrey | 437/47 |
| 4,882,289 | 11/1989 | Moriuchi et al. | 437/52 |
| 4,885,259 | 12/1989 | Osinski | 437/41 |
| 4,905,064 | 2/1990 | Yabu et al. | 257/306 |
| 4,910,566 | 3/1990 | Ema | 257/300 |
| 4,970,564 | 11/1990 | Kimura et al. | 257/306 |
| 5,025,295 | 6/1991 | Kuestars et al. | 257/301 |
| 5,091,761 | 2/1992 | Hiraiwa et al. | 257/306 |
| 5,128,273 | 7/1992 | Ema | 437/52 |
| 5,196,365 | 3/1993 | Gotou | 437/52 |
| 5,200,635 | 4/1993 | Kaga et al. | 257/306 |
| 5,272,367 | 12/1993 | Dennison et al. | 257/306 |

FOREIGN PATENT DOCUMENTS

| | | |
|---|---|---|
| 61-55258 | 7/1978 | Japan . |
| 55-178894 | 6/1980 | Japan . |
| 59-231851 | 3/1984 | Japan . |
| 61-258467 | 11/1986 | Japan . |
| 62-286270 | 5/1987 | Japan . |
| 62-145765 | 6/1987 | Japan . |
| 63-293967 | 1/1988 | Japan . |
| 63-58958 | 3/1988 | Japan . |

*Primary Examiner*—Robert P. Limanek
*Attorney, Agent, or Firm*—Fay Sharpe Beall Fagan Minnich & McKee

[57] ABSTRACT

A semiconductor memory device having STC cells wherein the major portions of active regions consisting of channel-forming portions are inclined at an angle of 45 degrees with respect to word lines and bit lines that meet at right angles with each other, thereby enabling the storage capacity portions to be arranged very densely and a sufficiently large capacity to be maintained with very small cell areas. Since the storage capacity portions are formed even on the bit lines, the bit lines are shielded, so that the capacity decreases between the bit lines and, hence, the memory array noise decreases. It is also possible to design the charge storage capacity portion so that a part of thereof has a form of a wall substantially vertical to the substrate in order to increase the capacity.

12 Claims, 20 Drawing Sheets

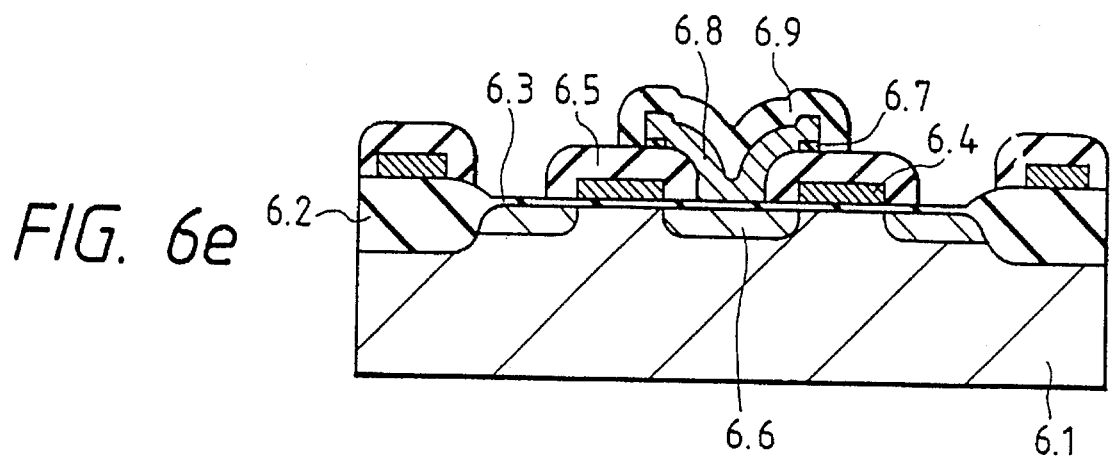
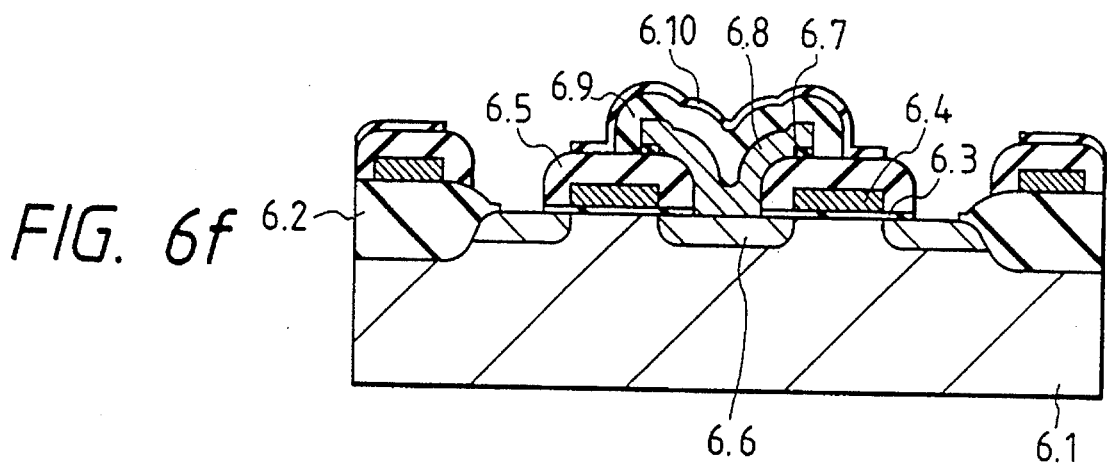
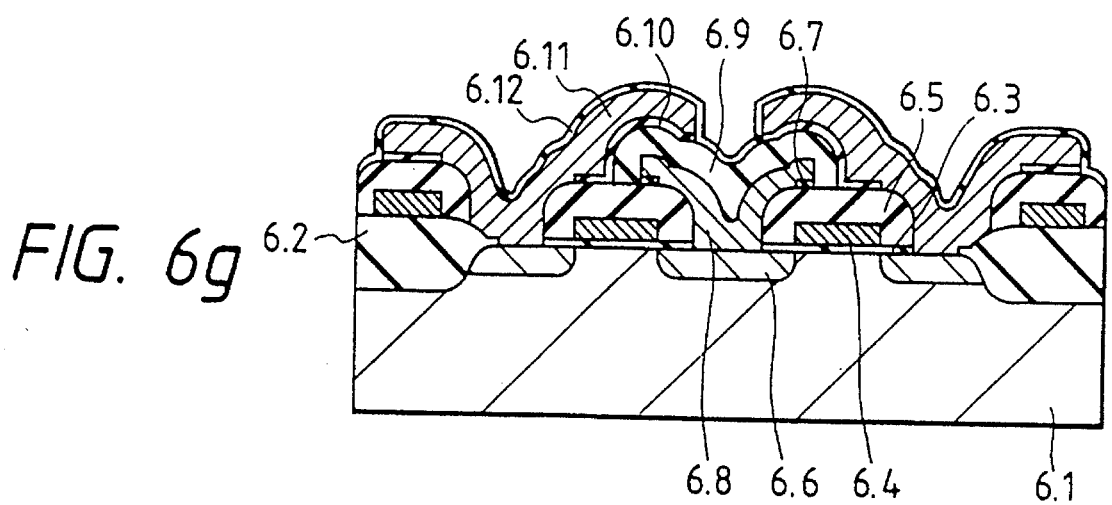

SEMICONDUCTOR MEMORY DEVICE HAVING STACKED CAPACITORS

This application is a continuation application of U.S. Ser. No. 08/072,482, filed Jun. 3, 1993, now U.S. Pat. No. 5,374,576, which was a continuation application of U.S. Ser. No. 07/805,383, filed Dec. 10, 1991, now abandoned, which was a divisional application of U.S. Ser. No. 07/475,148, filed Feb. 5, 1990, now U.S. Pat. No. 5,140,389, which was a continuation-in-part application of U.S. Ser. No. 07/287,881, filed Dec. 21, 1988, now U.S. Pat. No. 4,970,564.

BACKGROUND OF THE INVENTION

The present invention relates to a semiconductor memory device which is very small in size and has a large storage capacity, and more specifically to stacked capacitor (STC) cells of a dynamic random access memory (DRAM) that is adapted to being integrated highly densely.

The integration degree of a DRAM has quadrupled in every three years, and mega-bit memories have already been mass-produced. The degree of integration is heightened by decreasing the sizes of elements. However, reduction in the storage capacity accompanying the decrease in sizes has invited problems with regard to decrease in the signal-to-noise (S/N) ratio, inversion of signals caused by incident alpha particles and maintenance of reliability.

As a memory cell capable of increasing the storage capacity, therefore, a stacked capacitor cell in which part of a storage capacity portion is overlapped on a switching transistor or on an element isolating oxide film disclosed in Japanese Patent Publication No. 55258/1986 has been expected to substitute for the existing planar type capacitor.

FIG. 2 is a layout plan view of a conventional STC cell, wherein the reference numeral 2.1 denotes active regions where a channel region and an impurity diffusion layer will be formed to constitute a switching transistor, 2.2 denotes word lines that serve as gate electrodes for the switching transistor, 2.3 denotes contact holes through which the bit lines 2.8 come into contact with the diffusion layer in the substrate, 2.4 denote conductive layers that serve as pads for connecting the bit lines and the diffusion layer together, 2.5 denote contact holes for connecting the lower electrodes 2.6 of the storage capacity portions to the diffusion layer, 2.7 denotes plane electrodes, and 2.8 denotes bit lines.

With the STC cell, the storage capacity portion indicated by the lower electrode 2.6 of the storage capacity portion can be extended onto the word line, making it possible to realize a storage capacity which is considerably greater than that of a planar type cell in which only the surface of the substrate is utilized as a storage capacity portion. Therefore, even a small cell area employed for the mega-bit DRAM's is capable of producing a storage capacity which is large enough for operating the circuit. With the conventional planar type cell having the same cell area as the above-mentioned cell, however, it is difficult to obtain a required capacity even if thickness of the insulating film is reduced.

In fact, however, even the STC cell has many problems as will be described below in detail in conjunction with a sectional view of FIG. 4. The STC cell is fabricated through the later-described steps. First, on a single crystalline semiconductor substrate 4.1 is grown a relatively thick oxide film 4.2 for electrically isolating the individual elements by the widely known thermal oxidation method. The film thickness ranges from about 100 to about 1000 nm. Then, a gate insulating film 4.3 for forming a switching transistor is grown by the widely known thermal oxidation method. The film thickness decreases with the reduction in the size of element and, usually, ranges from 10 to 50 nm. Polycrystalline silicon containing impurities is deposited and is delineated by the widely known photolithograph method and the dry etching method to form a word line 4.4. Using the delineated word line as a mark, furthermore, impurities having a conductivity type different from that of the substrate 4.1 are introduced by the widely known ion implantation method thereby to form an impurity diffusion layer 4.5. It need not be pointed out that the heat treatment is necessary for activating the impurity diffusion layer. Then, in order to form a storage capacity portion, polycrystalline silicon 4.7 having the same type of conductivity is deposited by the widely known CVD chemical vapor deposition method so as to come into contact with the impurity diffusion layer in the substrate. As will be obvious from the plan view of FIG. 2, the polycrystalline silicon 4.7 is formed also on the word line 4.4 and on the element isolating film 4.2. Therefore, the area of the storage capacity portion increases and, hence, a large storage capacity is maintained.

At this moment, furthermore, polycrystalline silicon is also formed simultaneously even on a place where the contact hole (2.3 in FIG. 2) is formed to connect the bit line 4.11 to the impurity diffusion layer 4.5. Even when the distance between the word lines is small, therefore, the bit line can be connected to the diffusion layer via the polycrystalline silicon layer (2.4 in FIG. 2) without causing the bit line 4.11 and the word line 4.4 to be short-circuited to each other. Here, the reference numerals 4.6 and 4.10 denote interlayer insulating films.

In the STC cell of the conventional structure, however, a pad conductor layer 2.4 must be exposed when a plate electrode 4.9 is to be formed. This is because, the bit line 4.11 and the pad conductor layer must come into contact with each other through this place. In delineating the plate electrode, therefore, a highly sophisticated technology is required to stop the pad conductor layer from being etched accompanying the dry etching of the plate electrode using a very thin capacitor insulating film 4.8 that is formed also on the surface of the pad conductor layer, such that the pad conductor layer will not be ground.

In addition to the above-mentioned problem involved in the production, there exists another essential problem in that it is difficult to decrease the cell area so far as the above-mentioned cell structure is employed. This stems from the fact that a sufficiently large distance must be maintained between the plate electrode 4.9 and the pad conductor layer 2.4 so that the two will not come into contact with each other. It is allowable to omit the pad conductor layer 2.4. In this case, however, the distance between the word lines must be increased to prevent the short-circuiting between the bit lines 4.11 and the word lines 4.4, making it difficult to decrease the cell areas.

With the conventional STC structure as described above, it is difficult to decrease the cell area. Namely, the conventional STC cells are not applicable for very highly integrated DRAM's of 4-mega-bits or greater.

An STC structure free from these problems has been taught in Japanese Utility Model Laid-Open No. 178894/1980. FIG. 3 is a layout plan view of this STC cells. To simplify the drawing, there is shown no lower electrode of the storage capacity portion or plate electrode that is arranged on the contact hole 3.4 in the memory portion.

The feature of this structure resides in that in the active region 3.1, the bit line 3.5 is not arranged on a portion where a contact hole 3.4 of the memory portion is opened. It need not be pointed out that the bit line 3.5 is in contact with the impurity diffusion layer of the substrate through the contact hole 3.3. The storage capacity portion is formed after the bit lines have been formed. In forming the plate electrodes, therefore, there is no need of exposing the bit line contact portions that are shown in FIGS. 2 and 4. Reference numerals 3.2 denote lead wires.

That is, the plate electrodes need simply cover the memory cell portions.

According to such a cell structure in which the area of the lower electrode of the storage capacity portion is not limited by the delineation of plate electrode, a large storage capacity can be realized yet decreasing the cell area.

Even with this structure, however, great difficulty is involved to shorten the distance between the bit lines if bit lines 3.5 arranged in parallel are not simply overlapped on the contact holes 3.4 of the memory portion in the active region 3.1. In the layout of FIG. 3, the distance increases between the bit lines imposing limitation on reducing the cell area.

A memory cell structure which allows several layers of storage capacity portions to be laminated in order to further increase the storage capacity is proposed, as described in Japanese Patent Laid-Open No. 58958/1988.

This type of memory cell is shown in FIG. 17. The memory cell having this structure theoretically enables the storage capacity to be increased to any extent by laminating charge storage electrodes 18 in many layers. However, when the actual capability in the fabricating technique such as, for example, the focal depth of an exposing apparatus is taken into consideration, generation of a large difference in level is unfavorable. The allowable difference in level is about 0.5 μm in 64 mega-bit DRAM's using 0.3 μm technique. More specifically, in the case of the structure shown in FIG. 17, if it is assumed that the thickness of each electrode is 0.1 μm, it is considered that lamination is limited to two storage electrodes 18 and three plate electrodes 111. The number of opposing faces of the storage electrodes 18 and the plate electrodes 111 designed by the above-described structure of the electrodes is four at maximum. In 64 mega-bit DRAM's, the cell area is inferred to be about 1 μm². If it is assumed that the area of 1×1 μm² is used as the storage capacity as it is and that 40% of ineffective region exists for connecting the upper and lower electrodes, the effective area as a capacitor having a structure shown in FIG. 17 is obtained as follows:

$$1 \, \mu m \times 1 \, \mu m \times 4 \, faces \times 0.6 = 2.4 \, \mu m^2 \qquad (1)$$

In order to realize the above-described structure, at least two cycles of steps of laminating storage electrodes, at least two cycles of steps of forming electrode insulating films, at least one cycle of processing step for connecting upper and lower electrodes, step of forming a capacitor insulating film 19, step of forming a plate electrode 111, etc. are required, thereby disadvantageously greatly increasing the number of steps.

In FIG. 17, the reference numeral 11 represents an Si substrate, 12 an element isolating film, 14 a word line, 16 a bit line, 112 an interlayer insulating film and 113 an impurity diffusion layer.

SUMMARY OF THE INVENTION

In view of the problems involved in the aforementioned prior art, the object of the present invention is to provide a semiconductor memory device which is small in size and which has a large storage capacity. In particular, the object of the present invention is to provide a semiconductor memory device having fine STC structure that can be used for a highly densely integrated DRAM of 1 mega-bit or greater.

The semiconductor device referred to in the present invention consists of a switching transistor and a charge storage capacitor as a minimal unit.

FIG. 1 is a plan view illustrating the layout of memory cells according to the present invention. In the present invention, the main portions of active regions 1.1 are in parallel with neither the word lines 1.2 nor the bit lines 1.4 that are at right angles with each other. In order to arrange the active regions most densely according to the present invention, the main portions of active regions are arranged at an angle of 45 degrees with respect to the word lines and the bit lines, and only the portions where the contact holes 1.5 of the memory portion are opened are arranged in parallel with the bit lines. Furthermore, the four active regions closest to one active region have extensions of their major portions that meet at right angles with one another. In other words, if it is assumed that the center of the contact hole 1.3 for a bit line in one active region 1.1 is the origin, and that the distance between the contact holes for bit lines and a component parallel to the word line 1.2 is Dp while the distance between the contact holes for bit lines and a component parallel to the bit line 1.4 is Wp, the centers of the contact holes for bit lines of the four active regions which are the nearest neighbors to the active region 1.1 are (-Wp, Dp), (-Wp, -Dp), (Wp, Dp), (Wp, -Dp), respectively. The configuration of each of the active regions corresponds to the inverted configuration of the active region at the center. A memory array is constituted by arranging the unit plan layout diagram of FIG. 1 repetitively in the vertical and horizontal directions. Therefore, the peripheral portions of FIG. 1 have been partly omitted.

In FIG. 1, the reference numeral 1.3 denote a contact hole for a bit line, 1.6 denotes a lower electrode of a storage capacity portion, and 1.7 denotes a plate electrode.

In this specification, furthermore, the active region stands for all regions of the substrate surrounded by an element isolating insulating film i.e., a substrate region that is not covered with the element isolating insulating film. Substantially, the active region stands for a region that consists of "a region of impurity diffusion layer in contact with the bit lines", "region of impurity diffusion layer in contact with the lower electrodes of the storage capacity portions" and "a channel forming portion under the word lines". Further, the main portions of active regions stand for those portions where the channels of switching transistors are formed.

FIG. 5 is a sectional view illustrating the STC structure according to the present invention. In the present invention, the active regions are so arranged as to be inclined relative to the word lines and bit lines. Therefore, the sectional view of FIG. 5 is along the line that connects the centers of a pair of contact holes 1.5 of the memory portion.

According to the present invention, the active regions simply run in a tilted direction and are formed in a manner that is little different from the conventional forming method.

With the memory cell of the present invention shown in FIG. 1, the word lines 1.2 are tilted with respect to the active regions 1.1 but have their gate lengths determined by the shortest distance between the impurity diffusion layer in contact with the bit lines and the impurity diffusion layer in contact with the lower electrodes of the storage capacity portions, namely, by the shortest distance in the area at which the word line overlaps the active region.

The word lines 5.4 are insulated by an interlayer insulating film 5.6 from other conductor layers in a self-aligned manner. In this sectional view, the source and drain have simple structure of impurity diffusion layer. It is, however, also allowable to employ widely known diffusion layers for source and drain with graded impurity profile.

After the word lines are formed, ions are implanted using word lines as a mask in order to form impurity diffusion layers 5.5.

Next, bit lines 5.7 are formed. Like the word lines 5.4, the bit lines 5.7 are insulated using an insulating film 5.8 in a self-aligned manner. In the sectional view of FIG. 5, bit lines 5.7 exist having the same shape as the pad conductor layers 2.4 of FIG. 4.

With a lattice being constituted by the word lines and bit lines as described above, the surfaces are represented by a pair of diffusion layers in which the active regions 1.1 have been formed already in the valleys among the word lines and bit lines as is clear from the layout plan view of FIG. 1. Lower electrodes 1.6 and 5.9 of storage capacities are formed thereon. The lower electrodes are then delineated to form a capacitor insulating film 5.10, and a plate electrode 5.11 is formed thereon. The plate electrode 5.11 need not be delineated on the memory array unlike the case of STC cells shown in FIGS. 2 and 4. The reference numeral 5.12 denotes an interlayer insulating film on the plate electrode 5.11 on which aluminum wirings not shown will be formed.

In FIG. 5, the reference numeral 5.1 denotes a semiconductor substrate, 5.2 denotes an element isolating insulating film, 5.3 denotes a gate insulating film, and 5.8 denotes an interlayer insulating film.

The element isolating film 5.2 is formed on the surface of the single crystalline semiconductor substrate 5.1 other than the active regions.

The lower electrode 5.9 of the storage capacity portion is composed of a refractory metal such as tungsten or polycrystalline silicon and has a thickness of usually from 100 to 500 nm by taking the steps in thickness into consideration. However, the thickness need not be limited thereto only; e.g., the lower electrode 5.9 may have a large thickness as far as there does not develop any problem in regard to the steps in thicknesses.

Examples of the material of the capacitor insulating film 5.10 include silicon oxide film, silicon nitride film, a composite film consisting of silicon oxide film and silicon nitride film, and refractory metal oxide films such as $Ta_2O_5$ as well as a composite film of refractory metal oxide film and silicon oxide film and a composite film of refractory metal oxide film and silicon nitride film. The capacitor insulating film may have a thickness nearly equal to that of the conventional STC cells.

The material of the plate electrode 5.11 may be polycrystalline silicon or a refractory metal such as tungsten. The film thickness thereof may be nearly the same as that of the conventional STC cells.

The width and pitch of the word lines 5.4 and bit lines 5.7 are determined by the cell area. In the case of 16 mega-bits, for instance, the word lines have a width of 0.5 to 0.7 µm and a pitch of 1 to 1.4 µm, and the bit lines have a width of 0.6 to 0.9 µm and a pitch of 1.2 to 1.8 µm.

With the shape and arrangement of active regions being selected as described above, there exists no constraint on layout among the bit lines 3.5 that took place in the case of the traditional structure, and the pitch among the bit lines can be greatly decreased. That is, in the conventional structure, the bit lines 3.5 pass through one side only of the contact holes 3.4 of the memory portion. According to the present invention, on the other hand, the contact hole 1.5 of the memory portion is sandwiched between the two bit lines 1.4.

As described earlier, furthermore, both the word lines 1.2 and the bit lines 1.4 are insulated from other conductor layers in a self-aligned manner, making it possible to shorten the pitch among the word lines as well as to open, in a self-aligned manner, the contact holes 1.5 of the memory portion through which the storage capacity portions, i.e., lower electrodes 1.6 and 5.9 of storage capacities come into contact with the substrate.

By adapting the above-mentioned structure, a memory cell having a very small area can be constituted as shown in FIG. 1 to realize a very highly integrated DRAM of greater than 4-mega-bits.

In addition, unlike the conventional STC structure shown in FIG. 2, the lower electrodes 1.6 and 5.9 of the storage capacity portions are not limited for their areas by the delineation of the plate electrodes 1.7 and 5.11 formed thereon, and can be uniformly arranged maintaining a minimum delineating space. With the STC structure of the present invention, furthermore, the bit lines are completely covered by the plate electrodes having a fixed potential and by the conductor layers of the storage capacity portions. Therefore, the interline capacitance among the bit lines decreases greatly, and memory array noise decreases, i.e., coupling noise stemming from the interline capacitance decreases compared with that of the conventional structure.

One of the greatest problem in DRAM's is to increase the area of the storage capacity portion. To achieve this aim, it is better to duplicate the vertical component corresponding to the peripheral side wall, namely, a vertical area component than to duplicate the horizontal plane area component as described above. This is because although the area of the cell and the area of the storage capacity portion are reduced to ⅓ in each generation in a DRAM, the horizontal length of the storage capacity portion, namely, the vertical area component is only reduced to $\sqrt{1/3}$ to 60%. That is, to duplicate the vertical area component which has a smaller reduction ratio produces a greater area increasing effect. The horizontal length refers to the length in the direction parallel to the substrate and the vertical area component refers to the area component vertical to the substrate.

In this way, a semiconductor memory device of the present invention adopts a wall-like or plate-like storage electrode structure, and by using both outer and inner wall surfaces thereof as storage capacity portions, the area is made to difficult to reduce in spite of a finer cell. The present invention also provides the fabricating process of such a semiconductor memory device.

In the present invention, since a wall-like or plate-like storage electrode structure is adopted, as described above, it is possible to substantially duplicate the area occupied by the side wall by utilizing the outer and inner wall surfaces as the capacities. Furthermore, by increasing the walls concentrically, it is possible to further increase the side wall area component.

An embodiment shown in FIG. 16, which will be explained later in detail, enables the reduction of the number of steps and the formation of a storage capacity portion having a large area. For example, a storage capacity portion 1×1 µm² in area and 0.5 µm in thickness on the substrate is formed, as described above, if an electrode having a thickness of 0.1 μm is used, the total surface area of the storage capacity portion is calculated as follows (there is no ineffective region because there is no connecting portion):

1. Outer wall side surface component $$0.4 \, \mu m (\text{height}) \times 1 \, \mu m \times 4 = 1.67 \, \mu m^2 \quad (2)$$

2. Inner wall side surface component $$0.3 \, \mu m (\text{height}) \times (1 - 0.1 \times 2) \mu m \times 4 = 0.96 \, \mu m^2 \quad (3)$$

3. Horizontal Plane area component $$1 \, \mu m \times 1 \, \mu m = 1 \, \mu m^2 \quad (4)$$

Therefore, the total area becomes as follows:

$$1.6 + 0.96 + 1 = 3.56 \, \mu m^2 \quad (5)$$

In spite of a simple structure and a small number of steps, the storage capacity portion having the surface area 50% larger than that of the conventional memory cell shown in FIG. 17 is realized.

As the height of the wall-like storage capacity portion is greater, the storage capacity preferably increases but the difficulty in the fabricating process and the fabricating cost also increase. On the other hand, if there is any wall-like storage capacity portion, it exhibits the storage capacity increasing effect in its own way. It is therefore desirable that the height of the storage capacity portion is determined in the range which facilitates fabricating at a low cost depending upon the fabricating technique at the individual point.

It is unfavorable that the thickness of the lower electrode of the storage capacity portion is too large, because the height of the lower electrode occupies a large portion in the height of the storage capacity portion and since the recessed portion of the underlayer insulating film is filled, the vertical component of the storage capacity portion is unfavorably reduced in comparison with that of the storage capacity portion of the same height provided with a lower electrode having a smaller thickness. It is therefore desirable to confirm that the lower electrode has a thickness which does not completely fill the recessed portion of the underlayer insulating film by an experiment.

The above and other objects, features and advantages of the present invention will become clear from the following description of the preferred embodiments thereof, taken in conjunction with the accompanying drawings.

BRIEF DESCRIPTION OF THE DRAWINGS

FIGS. 6a to 6i are sectional views illustrating the steps of fabricating a memory cell according to a first embodiment of the present invention;

DESCRIPTION OF THE PREFERRED EMBODIMENTS

Embodiment 1

A first embodiment of the present invention will now be described in conjunction with FIGS. 6a to 6i.

Figure 6A:
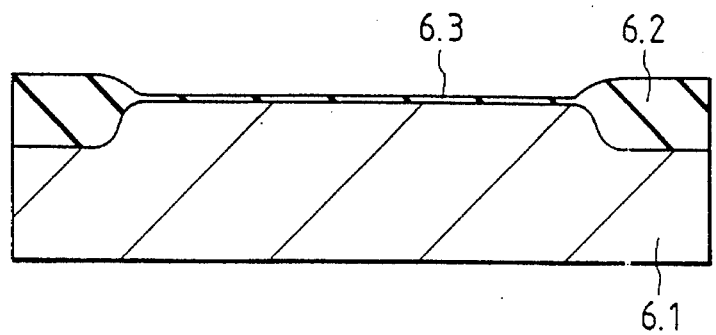
Figure 6B:
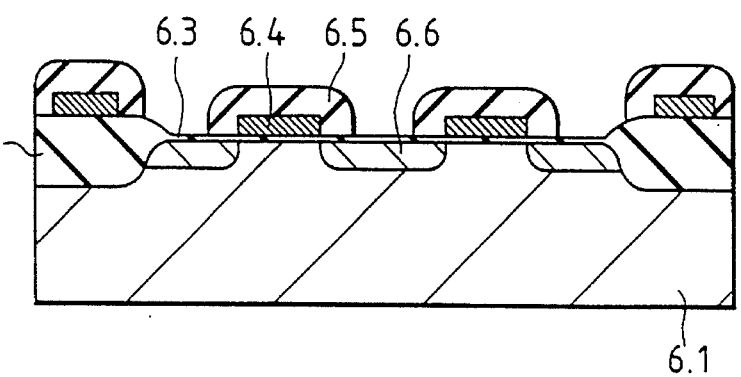

As shown in FIG. 6a, first, an element isolating film 6.2 for electrically isolating the individual elements and a gate insulating film 6.3 are grown on a single crystalline semiconductor substrate 6.1 of a first type of conductivity by the widely known thermal oxidation method. The element isolating film is grown over a range of 200 to 1000 nm and the gate insulating film is grown over a range of 10 to 20 nm. In the DRAM's of a mega-bit level, a known improved LOCOS method is employed to suppress the so-called extension of bird's beak, because the widths of active regions and widths of element isolating regions are the order of submicrons. Word lines 6.4 are formed on the surface as shown in FIG. 6b. Though this embodiment employs polycrystalline silicon containing impurities as a material for forming word lines, it is also allowable to use a polysilicide which is a laminated film consisting of low-resistance polycrystalline silicon and silicide, or a refractory metal represented by tungsten. The word lines have a width of 0.5 to 0.7 μm, a film thickness of 200 nm, and a pitch of 1 to 1.4 μm.

The word lines are covered with an interlayer insulating film 6.5 in a self-aligned manner. That is, in delineating polycrystalline silicon that forms word lines, the insulating film deposited thereon is used as a mask to effect the delineation, and the side walls that are exposed are covered with the side wall insulating films that are left when the insulating film that is further deposited thereon is subjected to the anisotropic dry etching.

Using the word lines as a mask, impurities having a conductivity type different from that of the substrate are ion-implanted in order to form impurity diffusion layers 6.6. The impurities are activated by the heat treatment at 800° C. to 1000° C. Though the sectional view of FIG. 6b shows a conventional single drain structure, it is allowable to use a widely known drain with a graded impurity profile.

The impurity diffusion layers 6.6 are isolated from each other by the element isolating oxide film 6.2 formed in a preceding step for each of the elements.

In this embodiment, the impurity diffusion layers are formed relying upon the ion implantation method. It was, however, also attempted to diffuse impurities from the bit lines 6.8 or from the lower electrodes 6.11 of storage capacities as described later. According to this method, no defect develops at all unlike the case of the ion implantation method, and a junction is realized with little leakage current enabling the memory retentivity of memory device to be improved.

Figure 6C:
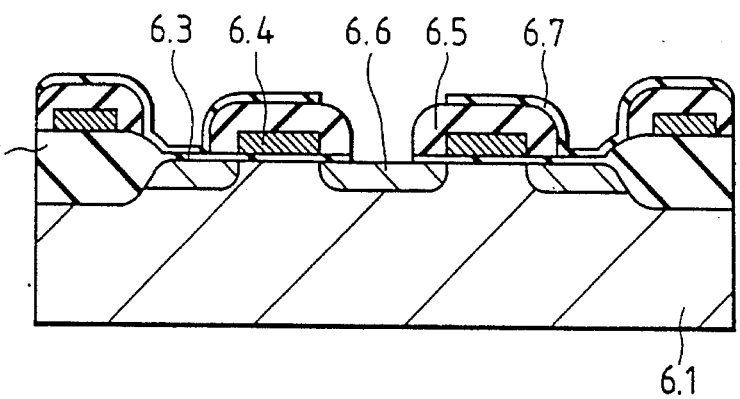

Next, referring to FIG. 6c, an insulating film 6.7 is deposited on the whole surface by the conventional CVD method, and only those portions where the bit lines come into contact with the diffusion layers in the substrate are opened (contact holes 1.3 for bit lines in FIG. 1) by the widely known photolithograph method and dry etching method. The insulating film 6.7 serves as an underlying layer when the bit lines are to be delineated in the next step, and prevents the surface of the substrate from being exposed and further prevents the element isolating film 6.2 from being ground. The film thickness is determined by the etching selecting ratio relative to the underlying layer when the bit lines are to be delineated. In this embodiment, however, the film thickness ranges from 20 to 100 nm.

Figure 6D:
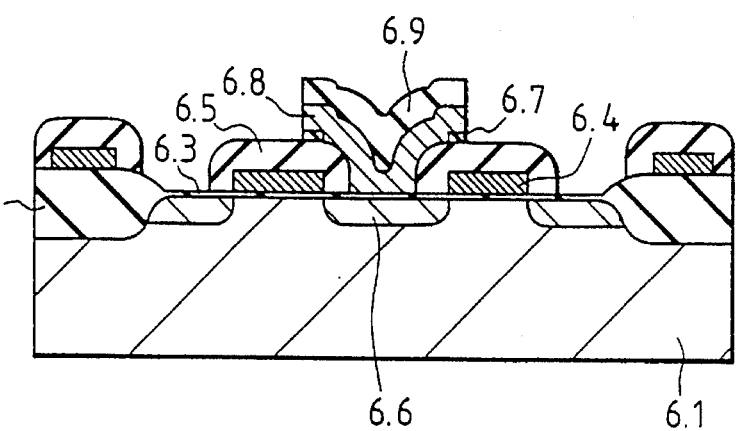

Referring to FIG. 6d, bit lines 6.8 are formed. The bit lines are delineated together with the insulating film 6.9. The bit lines have a width of 0.6 to 0.9 μm, a thickness of 250 nm and a pitch of 1.2 to 1.8 μm. In this embodiment, the storage capacity portions are formed by the heat treatment at high temperature after the bit lines have been formed. For this purpose, therefore, the bit lines are composed of a material that can withstand the heat treatment. Furthermore, a small resistance is also an essential requirement. In this embodiment, therefore, use is made of a polysilicide or tungsten, or a laminated film of a refractory metal nitride and a refractory metal. An insulating film is further deposited thereon, and side walls of bit lines that are exposed in FIG. 6d are covered relying upon the widely known dry etching method (FIG. 6e).

Figure 1:
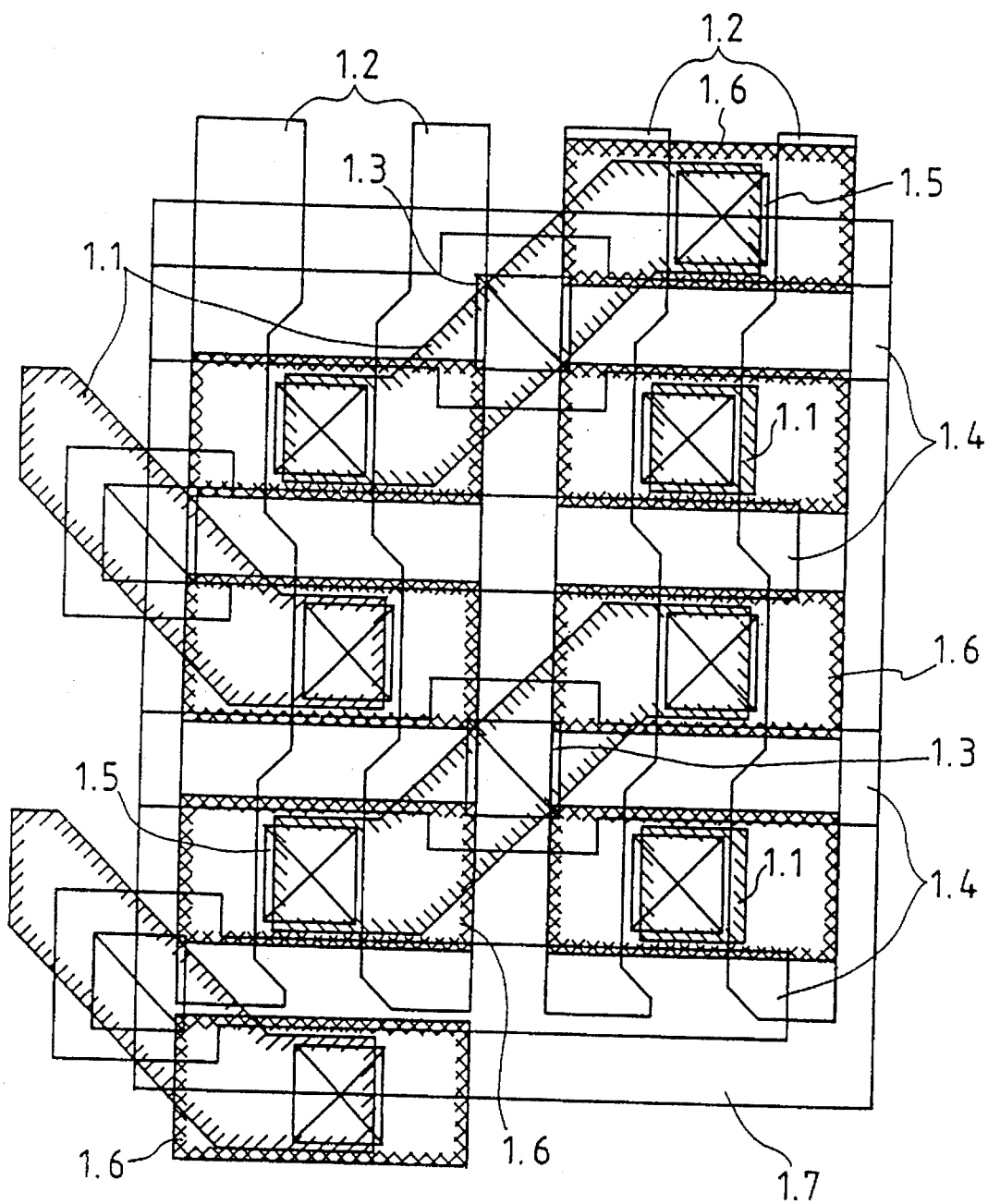
FIG. 1 is a plan view for explaining a memory cell in a semiconductor memory device of the present invention.
Figure 2:
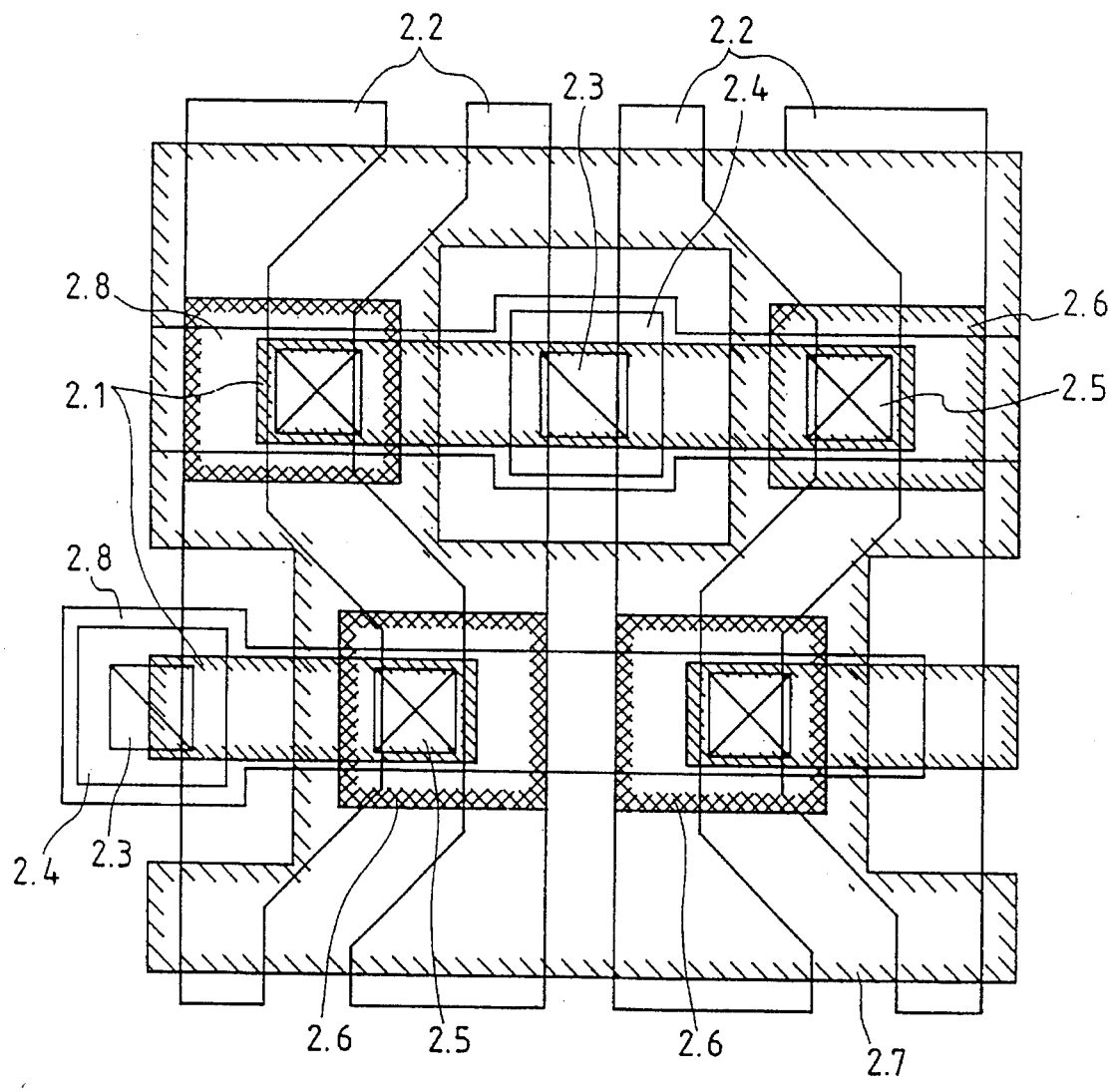
FIG. 2 is a plan view for explaining a conventional STC cell.
Figure 3:
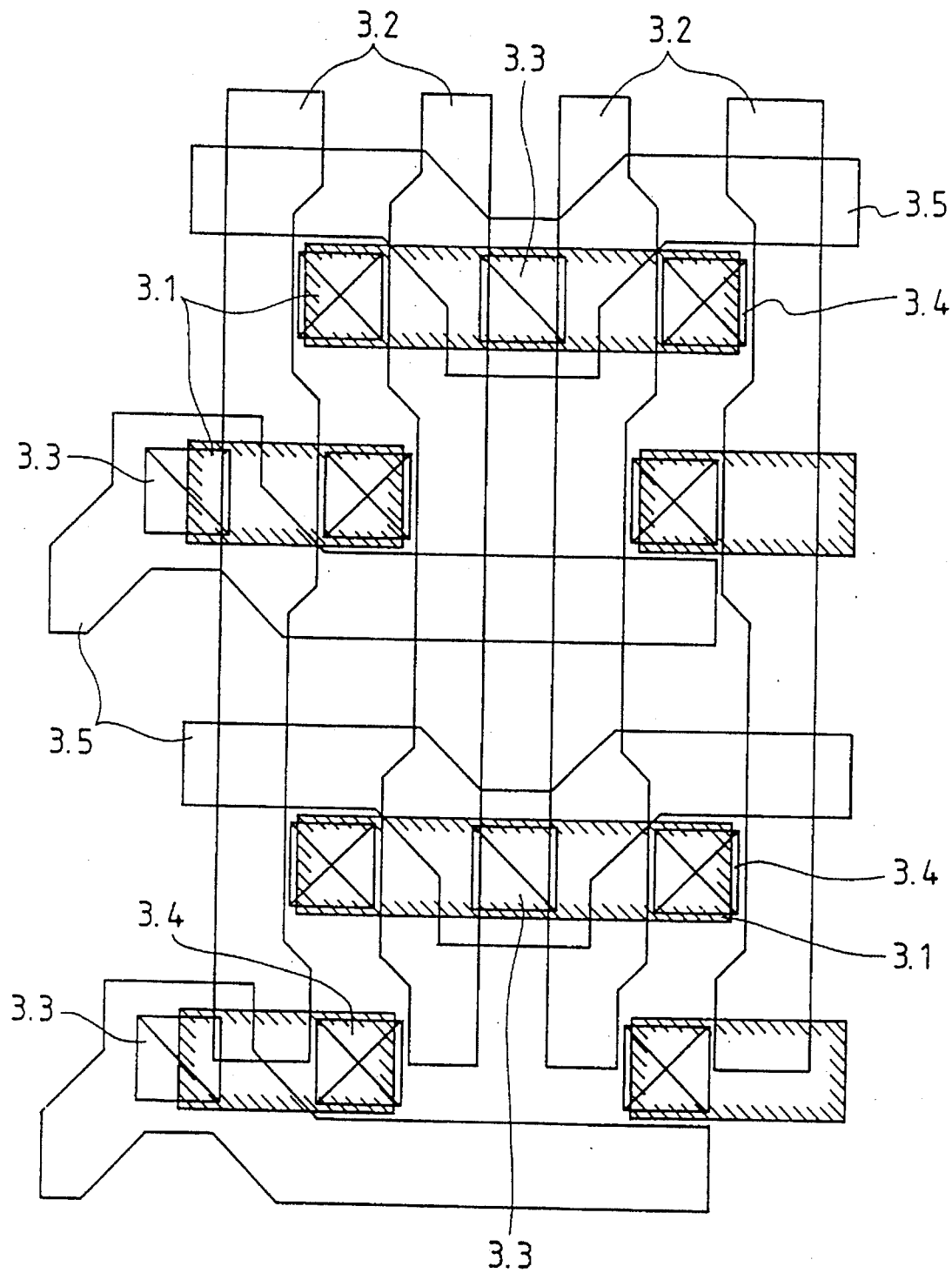
FIG. 3 is a plan view for explaining an STC cell according to another conventional art.
Figure 4:
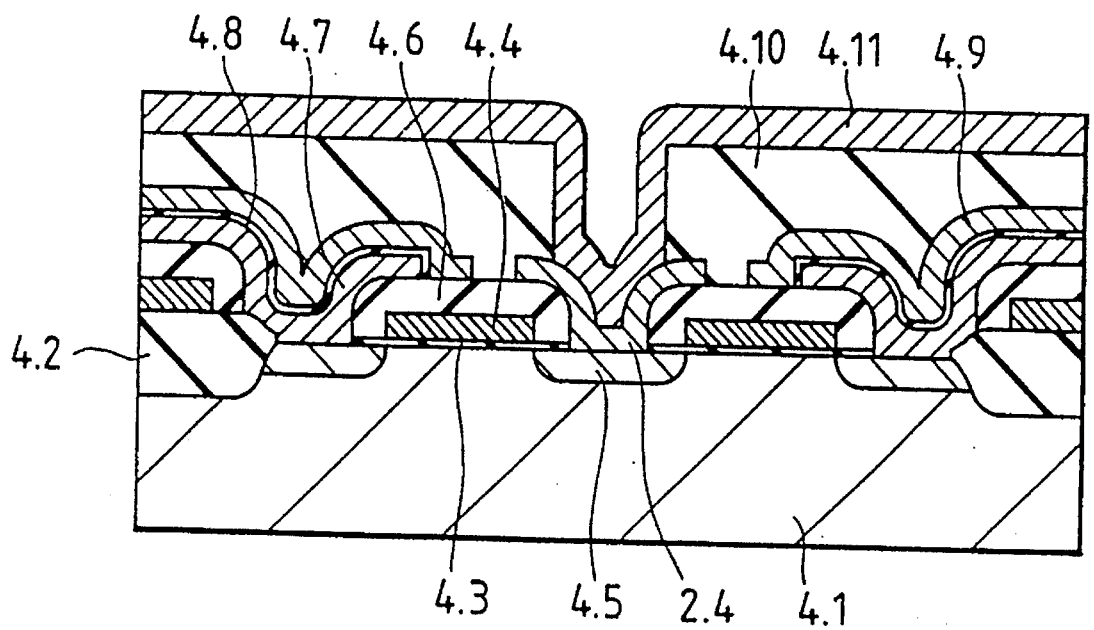
FIG. 4 is a sectional view of the STC cell shown in FIG. 2.

In this stage, the region where the contact hole 1.5 of the memory portion of FIG. 1 is opened, is surrounded by the word lines and bit lines that are insulated from each other. By removing the thin oxide film on the active region, the diffusion layer in contact with the storage capacity portion can be exposed. In this embodiment as shown in FIG. 6f, an insulating film 6.10 is deposited maintaining a thickness of about 10 to 100 nm so as to serve as an underlying layer for delineating the storage capacity portions, and the regions of the diffusion layers only are exposed. Thus, by insulating the word lines and the bit lines from each other in a self-aligned manner, the contact region of the memory portion is also formed in a self-aligned manner being surrounded thereby making a feature of the present invention.

Referring to FIG. 6g, there is formed the lower electrode 6.11 having a thickness of 300 to 350 nm of the storage capacity with the same conductivity type as that of the impurity diffusion layer, and a capacitor insulating film 6.12 is formed on the surface thereof maintaining a thickness of 3 to 10 nm. In this embodiment, though polycrystalline silicon containing impurities is used as the lower electrode, it is also allowable to use a refractory metal such as tungsten. As the capacitor insulating film, furthermore, there can be used a thermally oxidized film grown on the surface of polycrystalline silicon, a laminated film of an oxide film and a nitride film, a composed film of silicon oxide and silicon nitride, or an insulating film with a high dielectric constant such as $Ta_2O_5$ or a multi-layer film using an insulating film with a high dielectric constant.

Figure 6H:
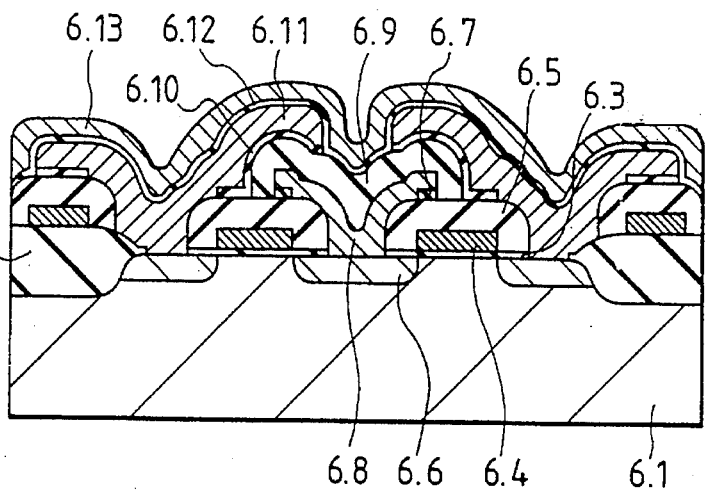

Referring to FIG. 6h, a plate electrode 6.13 is deposited maintaining a thickness of 100 to 150 nm to complete the storage capacity portion of a memory cell. The plate electrode need not be delineated on the memory cell making another feature of the present invention. The plate material consists of polycrystalline silicon-containing impurities or a refractory metal such as tungsten.

Figure 6I:
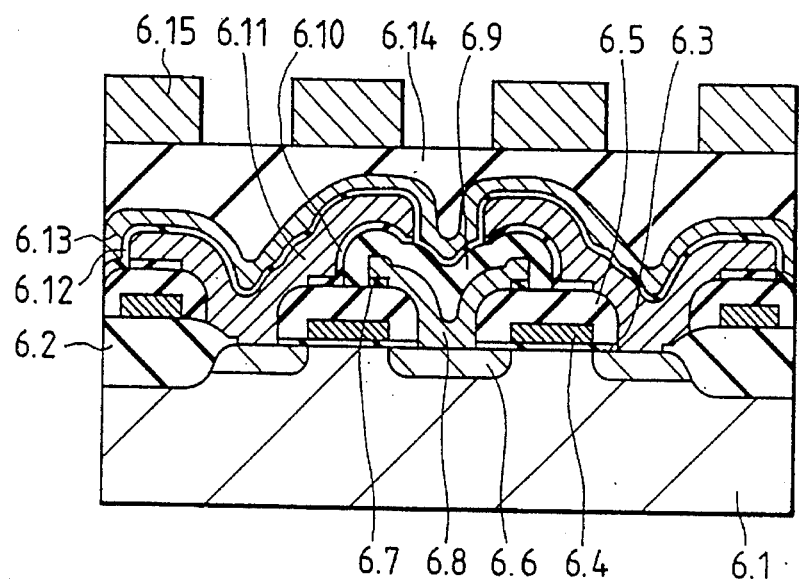

In FIGS. 6g to 6i, a portion of the insulating film 6.10 just on the bit line is missing and, instead, the capacitor insulating film 6.12 is shown as a unitary structure, in order to emphasize the fact that the insulating film 6.10 is ground to some extent when it serves as the underlying layer for delineating the lower electrode 6.11 of the storage capacity. In many cases, however, the insulating film 6.10 is left on this portion but having a reduced thickness.

Finally, an interlayer insulating film 6.14 is formed as shown in FIG. 6i, and an aluminum wiring 6.15 is formed thereon to complete the memory cell. According to this embodiment, the interlayer insulating film 6.5, insulating film 6.7, insulating film 6.9, insulating film 6.10 and interlayer insulating film 6.14 are all comprised of $SiO_2$ films. Further, the interlayer insulating film 6.5, insulating film 6.9 and interlayer insulating film 6.14 have thicknesses of 250 nm, 250 nm and 350 nm, respectively.

Embodiment 2

Figure 7:
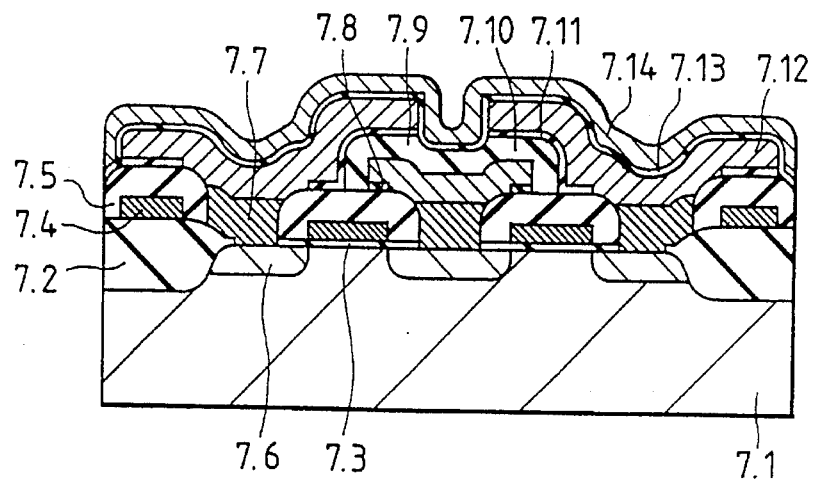
FIG. 7 is a sectional view of a memory cell according to a second embodiment of the present invention.

FIG. 7 illustrates a second embodiment of the present invention. The feature of this embodiment resides in that a conductor layer 7.7 composed of polycrystalline silicon having the same conductivity type as the impurity diffusion layer is selectively grown only on the impurity diffusion layer formed in the active region. The conductor layer 7.7 has a thickness of 200 to 300 nm. As described earlier, one of the features of the present invention resides in that the word lines and the bit lines are insulated from each other in a self-aligned manner. Therefore, substantial sizes of the contact hole 1.3 and contact hole 1.5 of the memory portion of FIG. 1 are determined by the thicknesses of the side wall insulating films; i.e., the contact holes are opened by the self-aligned process in a broad sense. In the case of the contact hole of the memory portion having an increased depth, however, the side wall insulating film may be ground at the time of delineating the bit lines and the underlying word lines may be exposed. In opening the contact holes of the memory portion, furthermore, the oxide film covering the side walls of word lines and bit lines may be ground such that the word lines and bit lines are exposed and develop short-circuiting with the storage capacity portion.

According to this embodiment, therefore, the region of diffusion layer is elevated to prevent the occurrence of the above-mentioned danger and to facilitate the delineation for opening the contact holes.

After the delineation of word lines 6.4 shown in FIG. 6*b* is finished, the gate insulating film 6.3 is removed and the conductor layer 7.7 is grown thereon. In this embodiment, the polycrystalline silicon is grown relying upon the widely known CVD method.

Reference numeral 7.1 denotes a single crystalline semiconductor substrate, 7.2 denotes an element isolating film, 7.3 denotes a gate insulating film, 7.4 denotes word lines, reference numerals 7.5, 7.8, 7.10 and 7.11 denote interlayer insulating films, 7.6 denotes impurity diffusion layers, 7.7 denotes selectively grown portions, 7.9 denotes bit lines, 7.12 denotes a lower electrode of storage capacity, 7.13 denotes a capacitor insulating film, and 7.14 denotes a plate electrode.

Embodiment 3

Figure 8A:
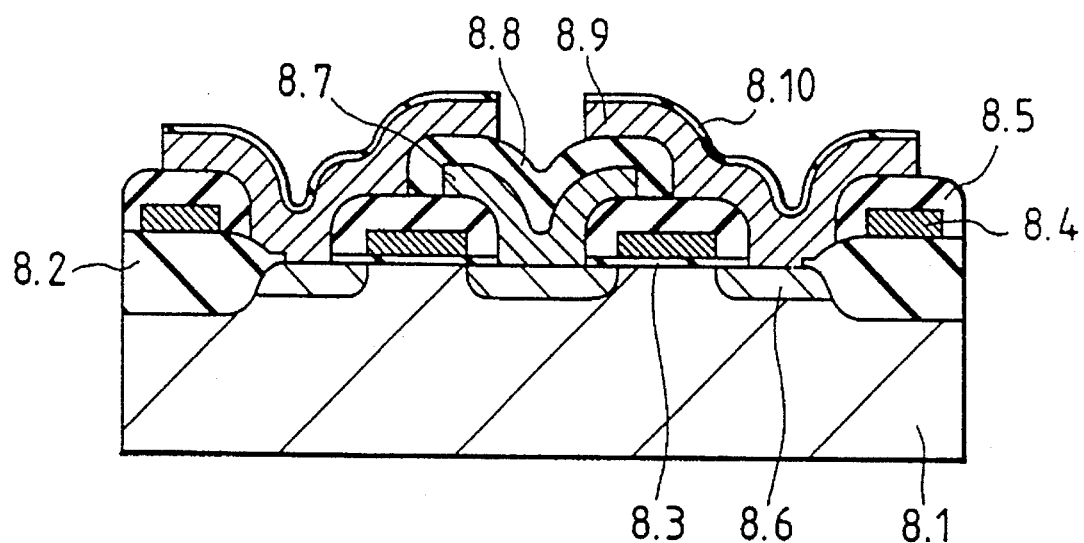
FIGS. 8a and 8b are sectional views illustrating the steps of fabricating a memory cell according to a third embodiment of the present invention.
Figure 8B:
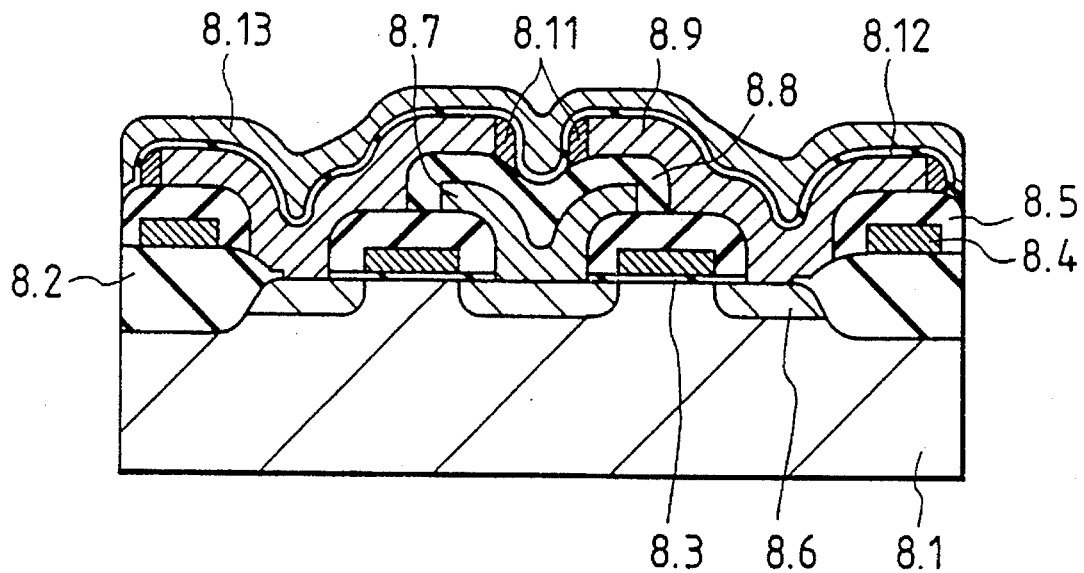

FIGS. 8*a* and 8*b* are sectional views illustrating the fabrication steps according to a third embodiment of the present invention. In this embodiment, the storage capacity portion is arranged on the uppermost portion of the memory cell, and there is no need of delineating the plate electrode on the memory cell. Therefore, the delineation of the plate electrode is not affected by the shape of the storage capacity portion. In this embodiment, this feature is utilized to increase the storage capacity portion. As shown in FIG. 8*a*, therefore, the insulation film 8.10 is formed on the surface of the lower electrode 8.9 of the storage capacity, and is delineated together therewith. Next, a conductor layer is deposited again on the surface thereof followed by anisotropic dry etching, so that the conductor layers deposited on the side walls are left as side wall portions 8.11 as shown in FIG. 8*b*. The capacity can be increased by the amounts of the side wall portions. This embodiment makes it possible to increase the capacity by 20 to 30% compared with that of the structure of Embodiment 1.

The lower electrodes 8.9 of storage capacities have been so delineated that the distance between the side walls thereof becomes as small as possible. When the side wall portions 8.11 are not provided, therefore, it is not allowed to decrease the distance between the side walls to be as small as that of this embodiment.

Here, the reference numeral 8.1 denotes a single crystalline semiconductor substrate, 8.2 denotes an element isolating film, 8.3 denotes a gate insulating film, 8.4 denotes word lines, the reference numerals 8.5 and 8.8 denote interlayer insulating films, 8.6 denote impurity diffusion layers, 8.7 denote bit lines, 8.9 denotes lower electrodes of storage capacities, 8.10 denotes an insulating film, 8.11 denotes side wall portions of lower electrodes, 8.12 denotes a capacitor insulating film, and 8.13 denotes a plate electrode.

Embodiment 4

Figure 9:
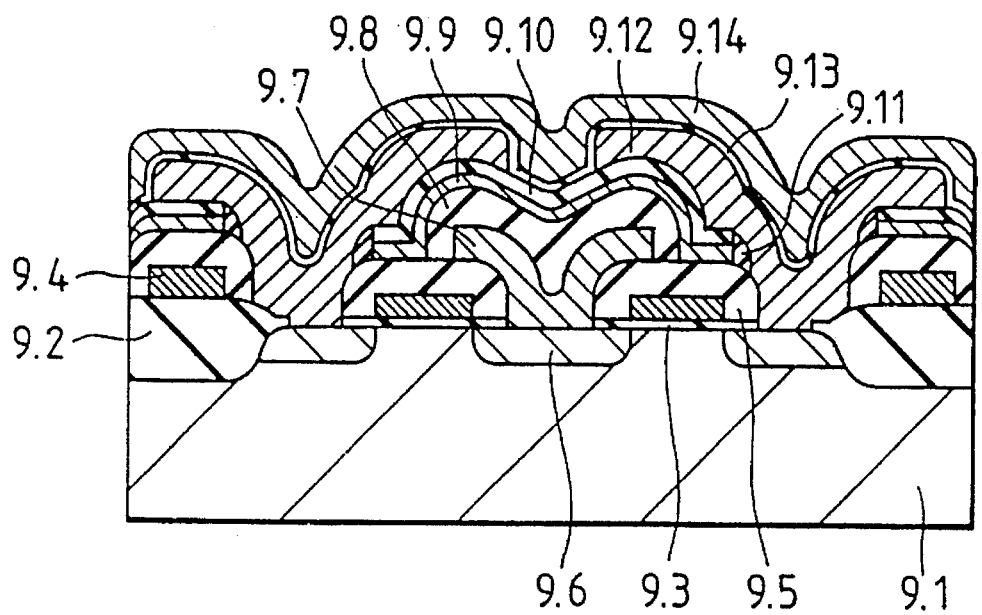
FIG. 9 is a sectional view of a memory cell according to a fourth embodiment of the present invention.

FIG. 9 illustrates a fourth embodiment of the present invention. In order to decrease the interline capacity between the bit lines 9.7 and other conductor layer according to this embodiment, the whole body is covered with a conductor layer 9.9 after the bit lines 9.7 have been formed, and the conductor layer is fixed to a given potential. Like when the word lines and bit lines are formed, the conductor layers 9.9 are formed being insulated in a self-aligned manner at the time of opening the contact holes of the memory portion. Therefore, the intermediate conductor layer can be formed without requiring any additional mask.

Here, the reference numeral 9.1 denotes a single crystalline semiconductor substrate, 9.2 denotes an element isolating film, 9.3 denotes a gate oxide film, 9.4 denotes a gate electrode, the reference numerals 9.5, 9.8, 9.10 and 9.11 denote interlayer insulating films, 9.6 denote impurity diffusion layers, 9.7 denote bit lines, 9.9 denotes an intermediate conductor layer, 9.12 denotes lower electrodes of storage capacities, 9.13 denotes a capacitor insulating film, and 9.14 denotes a plate electrode.

Embodiment 5

Figure 10:
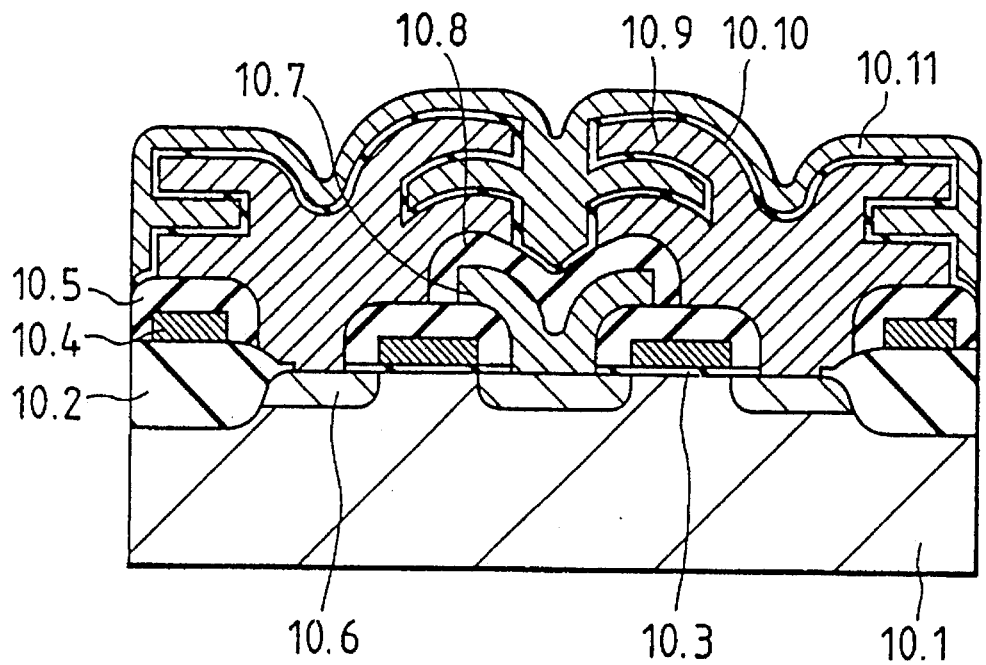
FIG. 10 is a sectional view of a memory cell according to a fifth embodiment of the present invention.

FIG. 10 illustrates a fifth embodiment of the present invention in which dents are formed in the side surfaces of lower electrodes 10.9 of the storage capacities in order to further increase the storage capacity. To form the dents, first, a conductor layer is deposited to form an underlying layer for the lower electrodes, an insulating film is deposited thereon, and contact holes are opened on the underlying layer only. Then, a conductor layer is deposited to form an upper layer, and is delineated together with the insulating layer that exists at an intermediate position as shown in FIG. 10, and only the insulating film sandwiched by the two conductor layers is removed. This enables dents to be formed in the intermediate positions. Thereafter, a capacitor insulating film 10.10 and a plate electrode 10.11 are formed. By employing the CVD method, in this case, even narrow gaps can be filled.

Here, the reference numeral 10.1 denotes a single crystalline semiconductor substrate, 10.2 denotes an element isolating film, 10.3 denotes a gate insulating film, 10.4 denotes word lines, the reference numerals 10.5 and 10.8 denote interlayer insulating films, 10.6 denotes impurity diffusion layers, 10.7 denotes bit lines, 10.9 denotes lower electrodes of storage capacities, 10.10 denotes a capacitor insulating film, and the reference numeral 10.11 denotes a plate electrode.

Embodiment 6

Figure 11A:
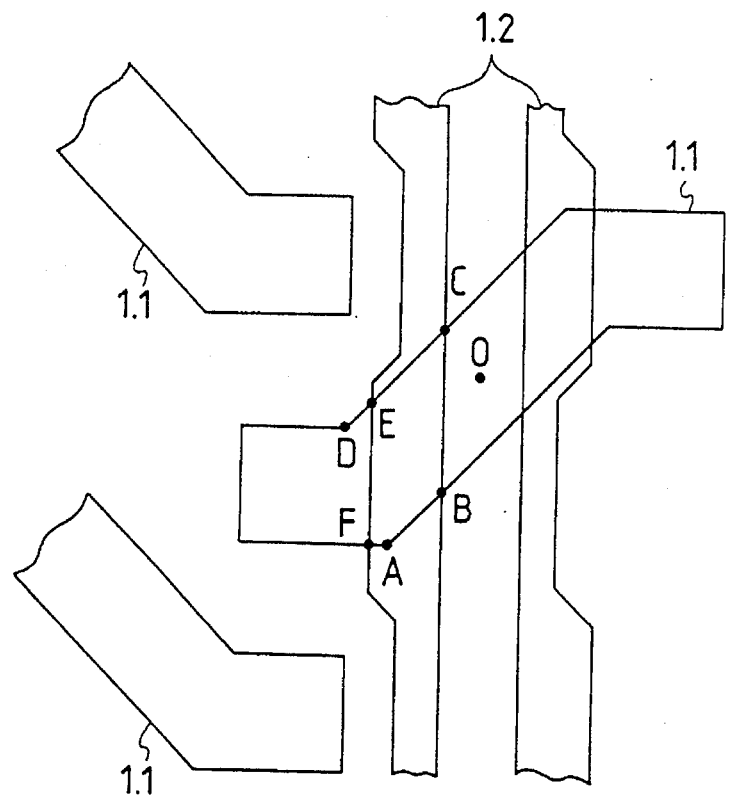
FIGS. 11a and 11b are schematic plan views of the active regions and the channel regions of a semiconductor memory cell according to the present invention, explaining the configurations thereof.
Figure 11B:
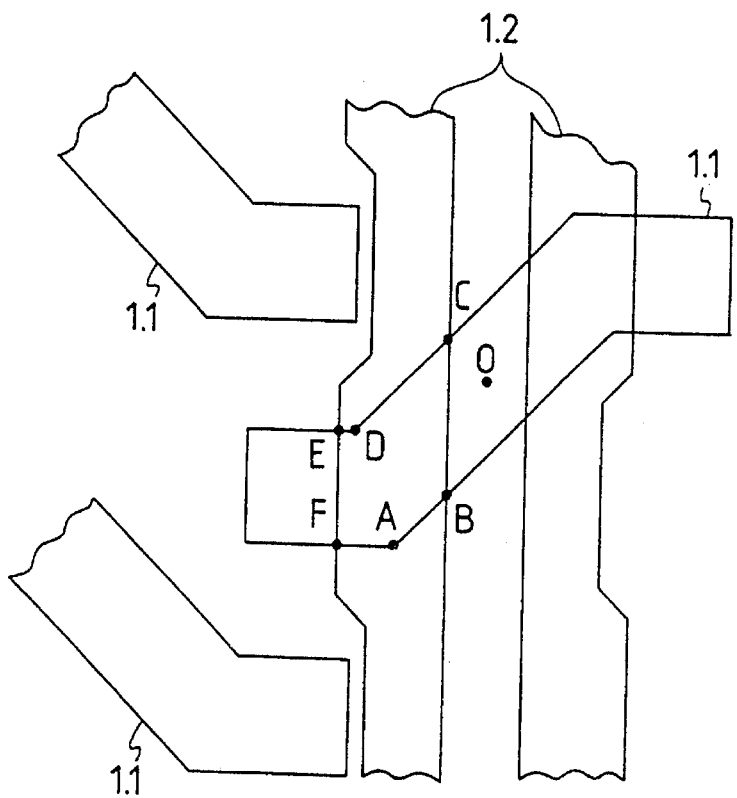

FIGS. 11*a* and 11*b* show the configurations of the main part of the embodiment shown in FIG. 1 which are characteristic of the present invention. In order to simplify explanation, only the active regions 1.1 and the word lines 1.2 are shown. Since it is required to secure an adequate channel length, the width of the word line 1.2 is large at the portion above the active region and small at the portion at which the element isolaing oxide film is formed. As a whole, the word line 1.2 is parallel to the shorter side or the longer side of a memory chip as in a conventional memory cell.

When the active region is arranged with the highest density in accordance with the layout rule while realizing the memory cell structure of the present invention, the main part of the active region 1.1 is inclined at 45 degrees with respect to the word line 1.2, as described above. However, if the rectangular active region is merely inclined at 45 degrees with respect to the word line 1.2, since the adjacent active regions interfere with each other, it is necessary to increase the cell area in order to satisfy the element isolating property. In other words, if the cell area is small, it is impossible to secure the portions where the lower electrodes 1.6 and 5.9 of the storage capacity portion come into contact with the active region after the bit line 1.4 is formed.

Figure 5:
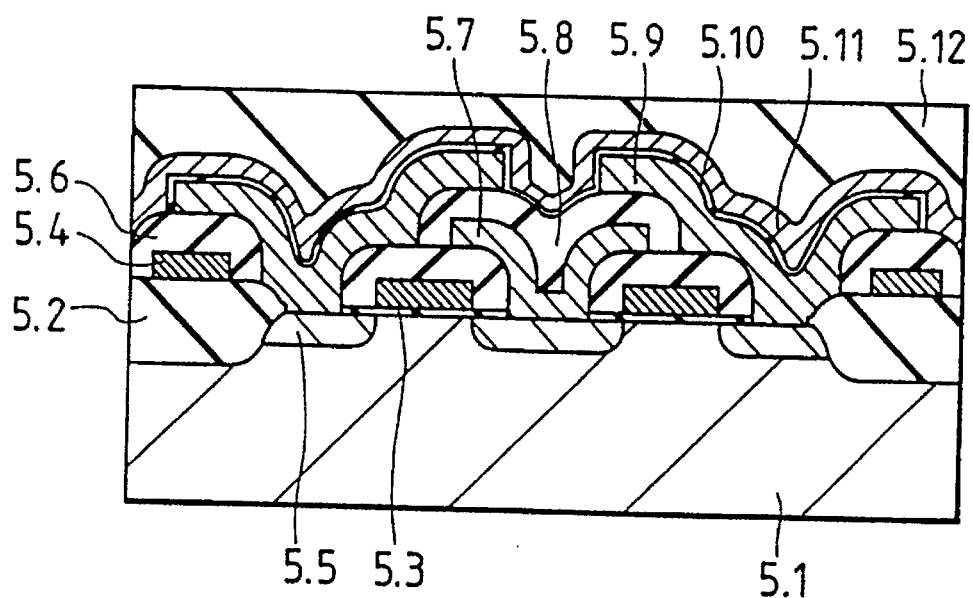
FIG. 5 is a sectional view of the STC cell shown in FIG. 1.

To solve this problem, the active region is composed of a portion which is inclined at 45 degrees with respect to the word line 1.2 and a portion which makes a right angle with the word line 1.2, as shown in FIGS. 11a and 11b. As a result, the active region is composed of a portion which crosses the bit line 1.4 at 45 degrees, which is orthogonal to the word line 1.2, and a portion which is parallel to the bit line 1.4. The longer the portion of the active region which is parallel to the bit line 1.4, the larger the portion where the lower electrode of the storage capacity portion (e.g. represented by the reference numeral 1.6 in FIG. 1 or 5.9 in FIG. 5) comes into contact with the substrate. This is preferable from the point of view of the improvement of conduction characteristic thereof. However, in order to secure the element isolating property with the adjacent active region, it is necessary to secure a space larger than the space allowed by the layout rule. It is, however, possible to reduce the space in the actual layout than the space allowed by the layout rule at a portion at which a vertex and another vertex or a straight line face each other, because the vertices of a layout pattern becomes roundish due to the limitation by the known photolithograph technique. In the active regions shown in FIGS. 11a and 11b, a space larger than 0.7 μm is taken between parallel patterns, but the narrowest space between a vertex and a straight line is 0.5 μm. On the resist pattern, a space larger than 0.7 μm is secured at any portion. In the case of strictly keeping the layout rule, it is also possible to secure an adequate space without impairing the conduction characteristic by notching a vertex.

The configuration of the channel region of a memory transistor at which the active region and the word lines 1.2 overlap is determined by the gate length, namely, the width of the word line. If a short gate length is allowed, since the point D on the active region 1.1 in FIG. 11a is situated at the outside of the word line 1.2, the channel region takes the form of a pentagon, and the interior angles of the vertices C, E, F, A and B are 45 degrees, 135 degrees, 90 degrees, 135 degrees, and 135 degrees, respectively. On the other hand, if the gate length is long, the channel region takes the form of a hexagon, as shown in FIG. 11b and the interior angles of the vertices C, D, E, F, A and B are 45 degrees, 225 degrees, 90 degrees, 90 degrees, 135 degrees, and 135 degrees, respectively. In the embodiment shown in FIGS. 11a and 11b, the width of the active region is 0.7 μm in a parallel linear region and the space between the active regions is also 0.7 μm. In FIG. 11b, the largest width of the word lines 1.2 is also 0.7 μm. The center of the contact hole for a bit line is the point O, and if it is assumed that the space between the word lines facing each other with the point O as the center is 0.5 μm, which is the minimum processing dimension, when the gate length is 0.7 μm, the channel region takes the form of a hexagon. When the gate length is less than 0.6 μm, the channel region takes the form of a pentagon.

The above discussion is about the layout of the memory cell and it goes without saying that the actual pattern transferred to the substrate has roundish vertices due to the limitation by the known photolithograph technique unlike the configurations shown in FIGS. 11a and 11b.

Embodiment 7

Figure 12:
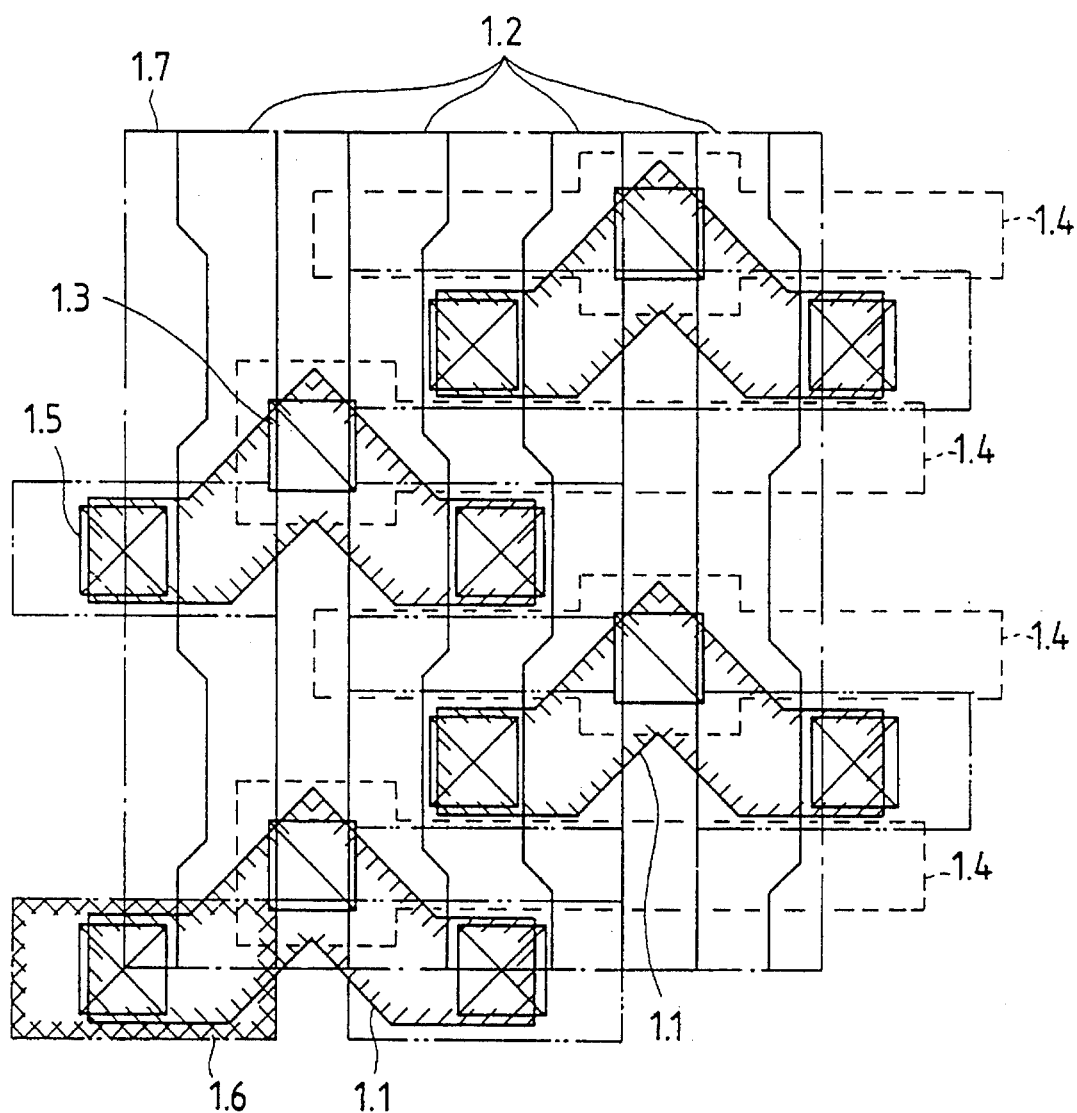
FIG. 12 is a plan view of a memory cell according to a seventh embodiment of the present invention.

In the memory array shown in FIG. 1, the configuration of the active region is symmetrical at 180 degrees with respect to the center of the contact hole for a bit line. The memory array, which is the same in the pitches of the word line and the bit line as shown in FIG. 1, can be realized by using another active region. An example is shown in FIG. 12. The active region 1.1 in FIG. 12 is symmetrical with respect to a line which passes the center of the contact hole 1.3 for a bit line and is parallel to the word line 1.2. If it is assumed that the center of the contact hole 1.3 for a bit line in one active region is the origin, the centers of the contact holes for bit lines of the four active regions which are the nearest neighbors to the one active region are $(-W_p, D_p)$, $(-W_p, -D_p)$, $(Wp, Dp)$, $(Wp, -Dp)$, respectively. The configuration of each of the active regions corresponds to the configuration of the active region at the center which is moved in parallel. The memory array is constituted by repetitively arranging these active regions as one unit.

In this active region configuration, it is also possible to form a storage capacity portion after the formation of the bit lines 1.4 as characterized in the present invention, while realizing the channel region inclined with respect to the word line. So long as the same layout rule is adopted, the word line pitch and the bit line pitch are the same and the storage capacity is naturally the same as in the memory cell shown in FIG. 1. The arrangement of the active regions shown in FIG. 12 produces a folded bit line type memory cell in the same way as in the embodiment shown in FIG. 1. The method of fabricating the memory cell is also completely the same as in the embodiment shown in FIG. 1.

Embodiment 8

In order to prevent the lowering of the S/N ratio, a folded bit line type memory array is adopted for more than a 64 kilo-bit memory. In this type of memory array, since the word line constantly passes under a pair of bit lines, coupling noise is produced on the two bit lines in the same phase, which is advantageously cancelled by each other at the time of sensing. On the other hand, in an open bit line type memory array, since the difference in the parasitic capacity of a pair of bit lines leads to noise, the memory is disadvantageously weak in noise.

Figure 13:
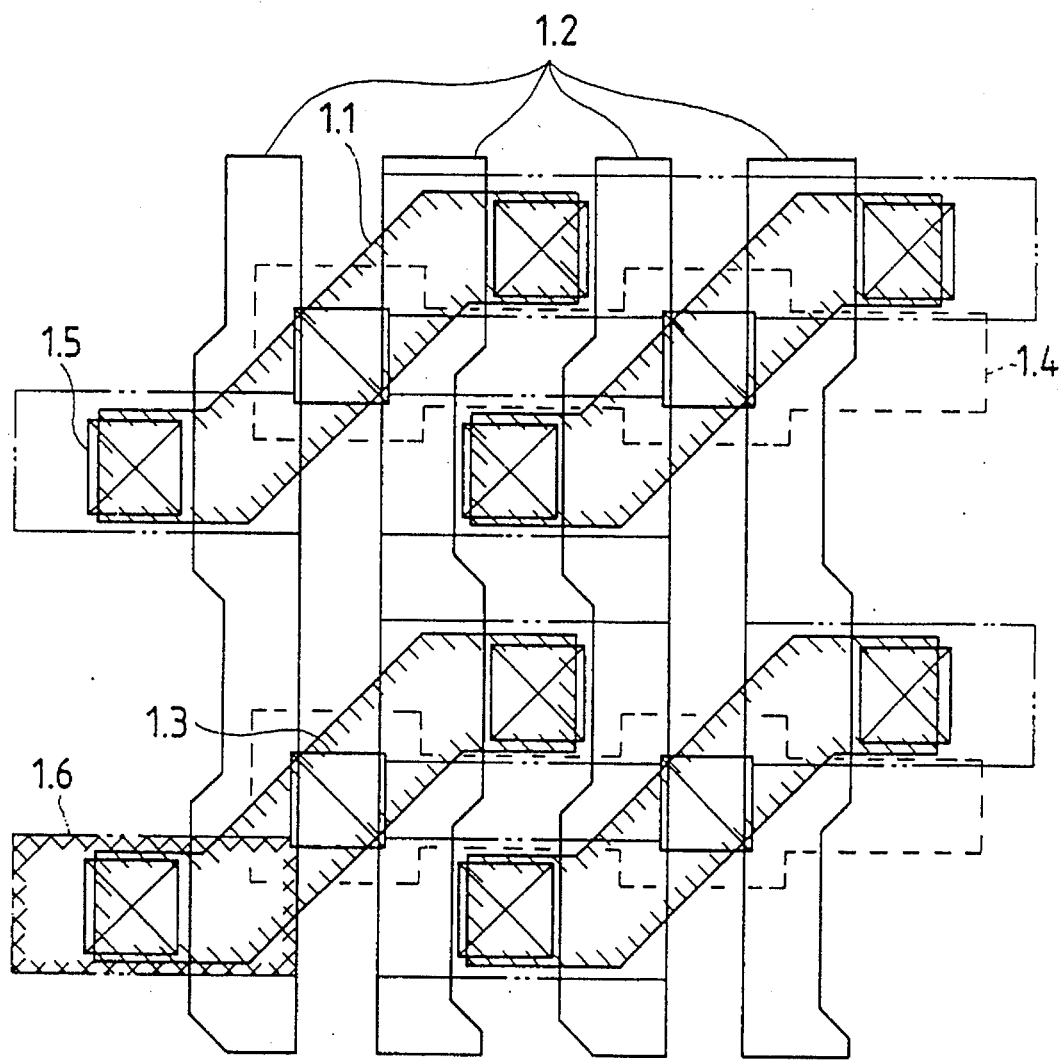
FIG. 13 is a plan view of a memory cell according to an eighth embodiment of the present invention.

FIG. 13 shows a part of an open bit line type memory array using a semiconductor memory device of the present invention. The plate electrode is omitted in FIG. 13 to simplify explanation. The plate electrode is merely a conductive layer covering the memory array in the same way as in the above-described embodiments, and has no hole at least above the memory array. In this embodiment, the active region which is symmetrical at 180 degrees with respect to the center of the contact hole 1.3 for a bit line is shown as an example.

The open bit line type memory array is constituted by moving one active region in parallel with the original position in the coordinates with the center of the contact hole 1.3 for a bit line as the origin such that the centers of the contact holes for bit lines of the four active regions which are the nearest neighbors to the one active region are (-Wp, -Dp), (-Wp, O), (Wp, O), (Wp, Dp), respectively. The symbols Wp and Dp respectively represent the distance between the contact holes for the bit line and a component parallel to the bit line 1.4, and the distance between the contact holes for the bit line and a component parallel to the word line 1.2. If attention is paid at one bit line, it will be understood that all the word lines intersecting the bit line has memory capacity portions, which is different from a folded bit line type memory array with storage capacity portions alternately provided on a pair of bit lines.

The method of fabricating the memory cell of this embodiment is substantially the same as in the embodiment shown in FIG. 1. Incidentally, in the memory cells shown in FIGS. 1 and 12, since the contact hole 1.5 of the memory capacity portion is surrounded by the two word lines 1.2 and the two bit lines 1.4, the lower electrode of the storage capacity portion can be processed on the words lines and the bit lines. In contrast, in the memory cell shown in FIG. 13, since the pitch of the bit lines is large, no bit line is disposed on one side of each of the contact holes 1.5 of the storage capacity portions. Therefore, there is a slight difference in the configuration of the lower electrode 1.6 of the storage capacity portions between them when compared in the actual memory level difference, but this does not produce a serious problem in processing.

Embodiment 9

Figure 14:
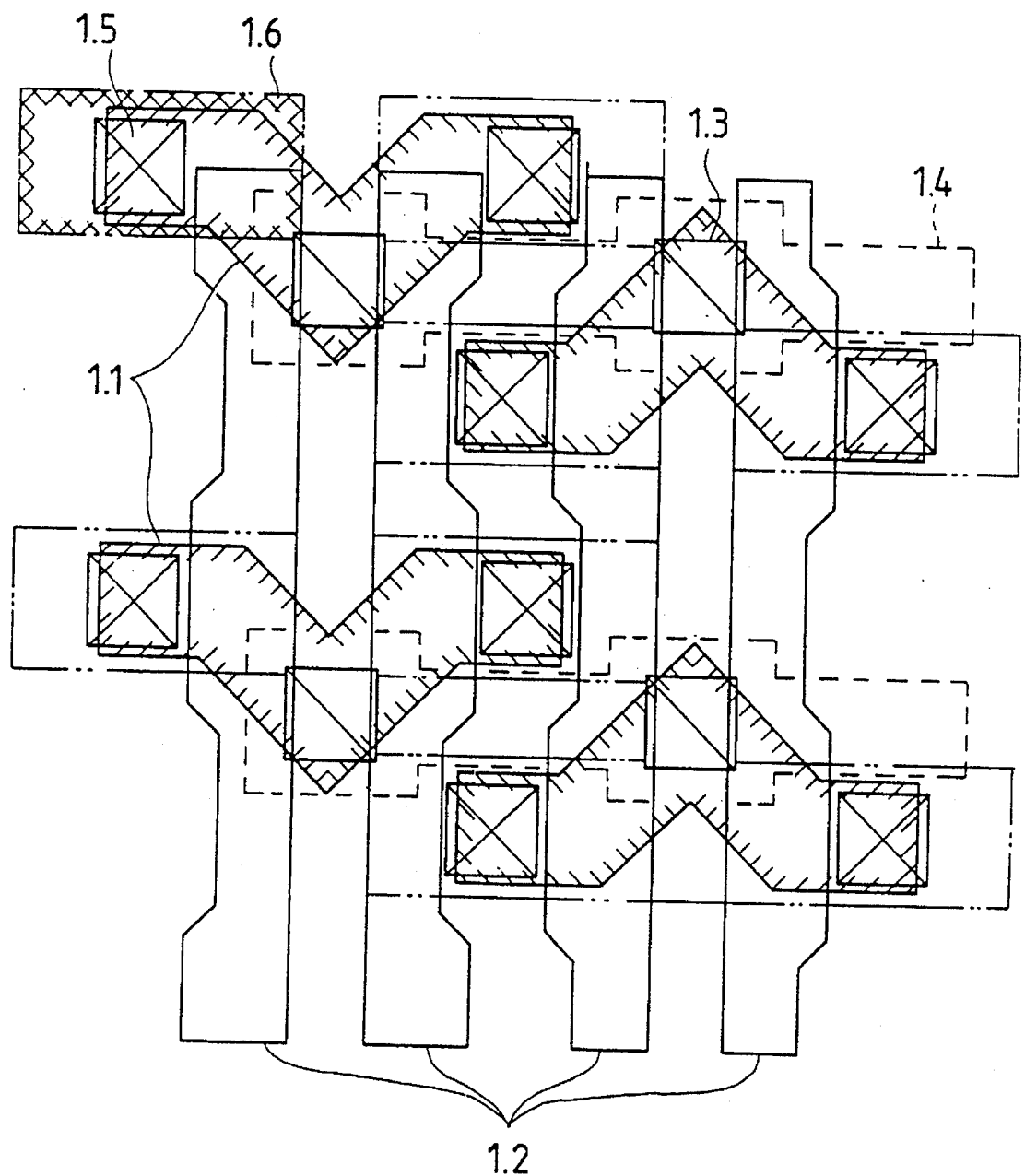
FIG. 14 is a plan view of a memory cell according to a ninth embodiment of the present invention.

A ninth embodiment shown in FIG. 14 is an open bit line type memory array using active regions which are symmetrical with respect to a line. If it is assumed that the center of the contact hole 1.3 for a bit line in one active region 1.1 is the origin of a coordinate system, the centers of the contact holes for bit lines of the four active regions which are the nearest neighbors to the one active region are (-Wp, 0), (-Wp, -Dp), (Wp, 0), (Wp, -Dp), respectively. The configuration of each of the active regions corresponds to the configuration of the active region at the center which is rotated by 180 degrees or inverted. The memory cell having the completely same word line pitch and bit line pitch as in the embodiment shown in FIG. 13 is realized.

Embodiment 10

In the memory cell of the present invention, since the word lines and the bit lines intersect each other and the memory capacity portion is formed thereon, it is necessary to delineate the lower electrode of the storage capacity portion at a large level difference portion. For example, if it is assumed that the thickness of the word line is 200 nm, the thickness of the bit line is 200 nm, and the thickness of the oxide film for insulating each of the lines in self-alignment is 250 nm, the level difference of the portion at which the word line and the bit line intersect each other is 900 nm from the surface of the substrate. In delineating the lower electrode of the storage capacity portion, it is necessary to remove the electrode layer (polycrystalline silicon) attached to the side wall of the level difference of 900 nm mentioned above. Especially, in the memory cell, since the region surrounded by two word lines and two bit lines takes the form of a deep trench, it is difficult to completely remove the polycrystalline silicon therefrom to isolate the lower electrode of the storage capacity portion from another storage capacity portion. The layout of the lower electrode 1.6 of the storage portion shown in FIG. 1 has this problem and, in the worse case, the lower electrodes 1.6 are connected with each other.

Figure 15:
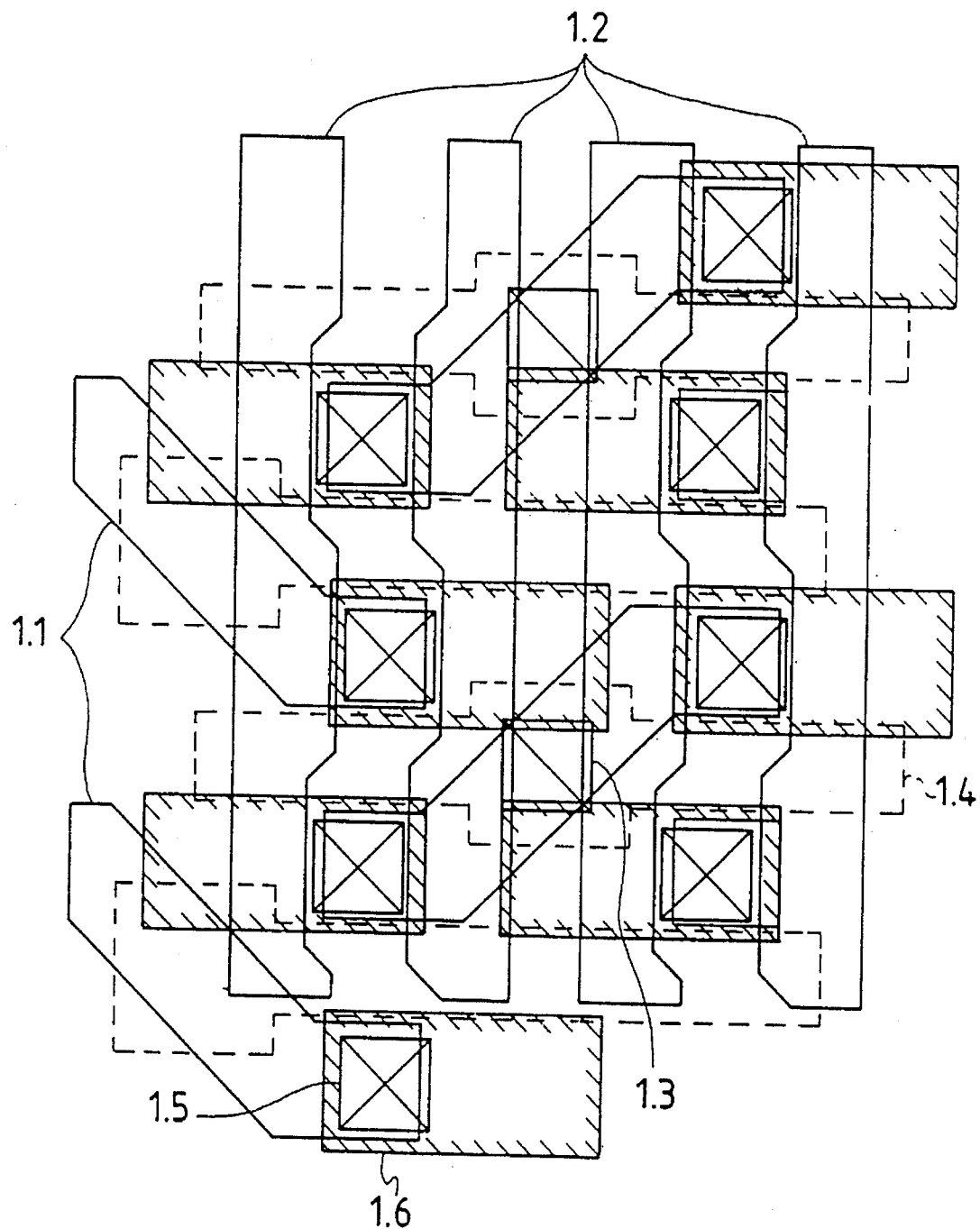
FIG. 15 is a plan view of a memory cell according to a tenth embodiment of the present invention.

The layout for ameliorating this problem is shown in FIG. 15. In the memory cell layout, the configuration and the arrangement of the patterns are the same as in the layout shown in FIG. 1 except for the arrangement of the lower electrode 1.6 of the storage portions.

In this embodiment, the lower electrodes are disposed non in alignment in each file shown on FIG. 15 but in deviation from the positions of the lower electrodes in the adjacent rows such that each deep trench formed by the two word lines 1.2 and the two bit lines 1.4 is filled up with the corresponding lower electrode. As a result, at least in the memory array, the delineation of the lower electrodes at the level difference at which the word line and the bit line intersect each other is obviated, thereby eliminating the problem of short-circuit of the lower electrode. Around the memory array, however, the delineation of the lower electrode at the high level difference is essential and incomplete delineation of the lower electrode leaves the polycrystalline silicon along the level difference around the memory array. However, since no deep trench is produced around the memory array, the removal of the polycrystalline silicon is easier than in the memory array. Even if the polycrystalline silicon remains around the memory array, so long as it is isolated from the lower electrode in the memory array, there is no problem in the operation of the memory.

Embodiment 11

Figure 16:
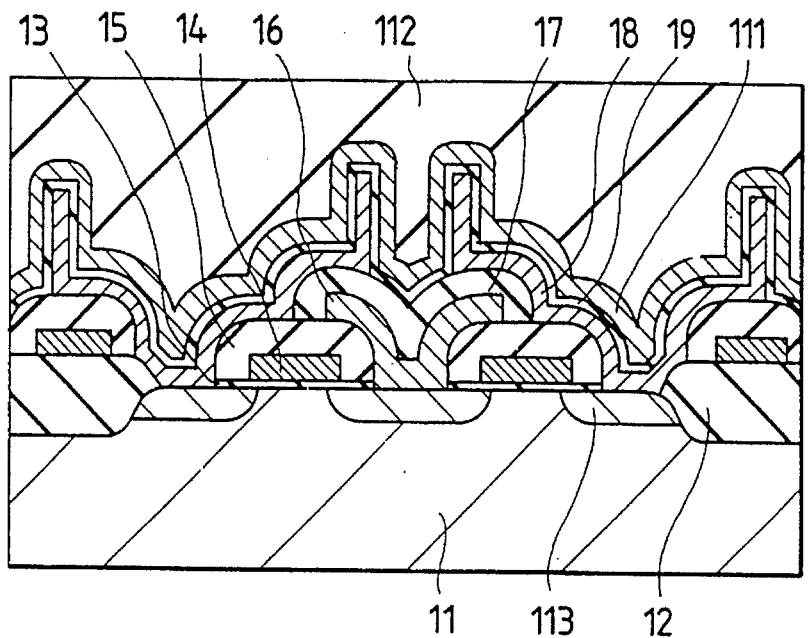
FIG. 16 is a sectional view of a memory cell according to an eleventh embodiment of the present invention.
Figure 17:
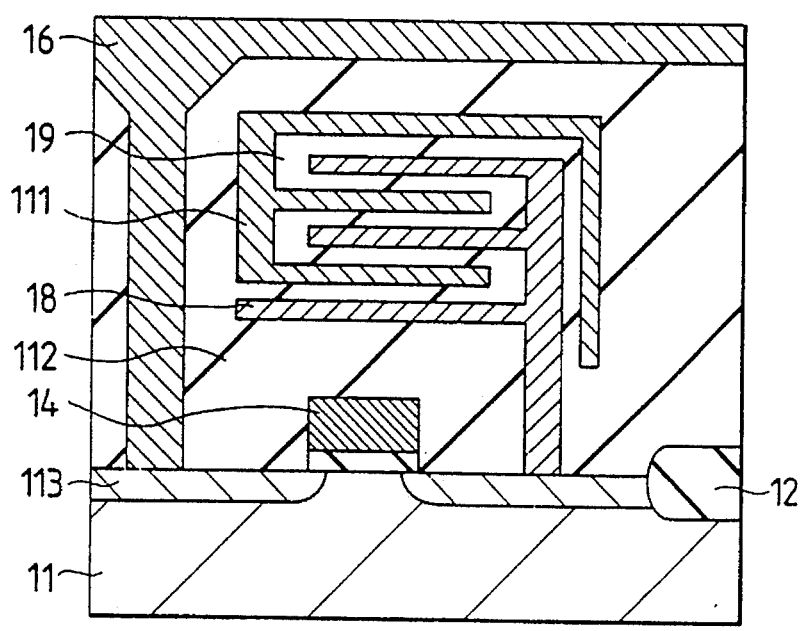
FIG. 17 is a sectional view of a conventional STC cell.

An embodiment shown in FIG. 16 has a structure in which a charge storage electrode 18 is laminated on a word line 14 and a bit line 16, thereby enabling the plane area of the charge storage electrode 18 to the maximum except for the space between the charge storage electrodes. Since the wall-like charge storage electrode 18 is adopted so as to use the surface of the inner wall surface as a storage capacity portion, it is possible to increase the storage capacity.

In FIG. 16, the reference numeral 11 represents an Si substrate, 12 an element isolating film, 15 and 17 interlayer insulating films, 19 a capacitor insulating film, 111 a plate electrode, 112 an interlayer insulating film, and 113 an impurity diffusion layer.

Figure 18A:
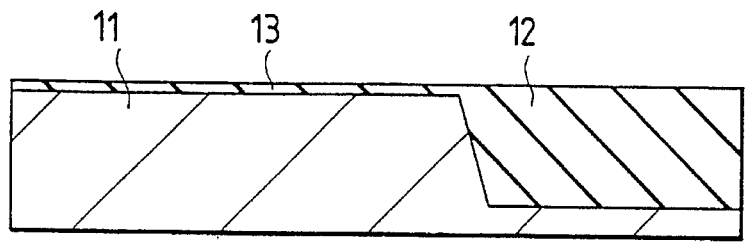
FIGS. 18a to 18j are sectional views illustrating the steps of fabricating a memory cell according to the eleventh embodiment of the present invention shown in FIG. 16.
Figure 18B:
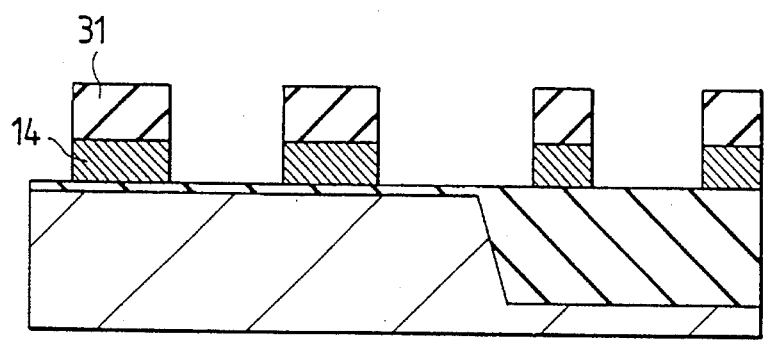

The process of fabricating the embodiment shown in FIG. 16 will be explained with reference to the steps shown in FIGS. 18a to 18j. The element isolating film 12 and the gate oxide film 13 are first formed on the p-type Si substrate 11 having a crystal orientation of (100) plane and a specific resistance of 10 Ωcm, as shown in FIG. 18a. A polycrystalline Si film 14 doped with phosphorus at a dosage of more than about $10^{20}$ cm$^{-3}$ and an SiO$_2$ film are then deposited on the gate oxide film 13 by CVD (Chemical Vapor Deposition). Thereafter, the SiO$_2$ film and the polycrystalline Si film are delineated by Anisotropic etching using a resist pattern (not shown) as a mask so as to form the word line (polycrystalline Si) and an SiO$_2$ layer 31, as shown in FIG. 18b. The thickness of the polycrystalline Si film is 150 nm and the thickness of the SiO$_2$ layer 31 is 200 nm.

Figure 18C:
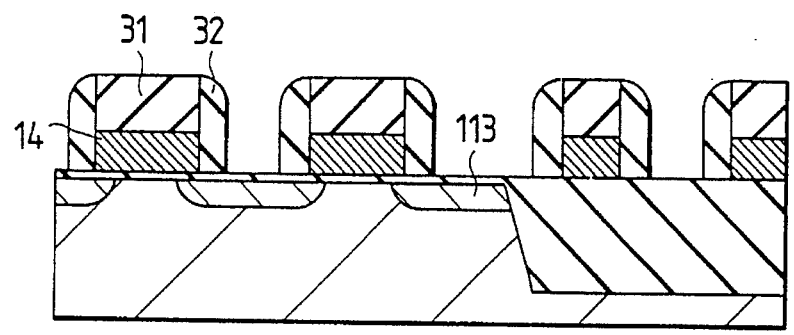
Figure 18D:
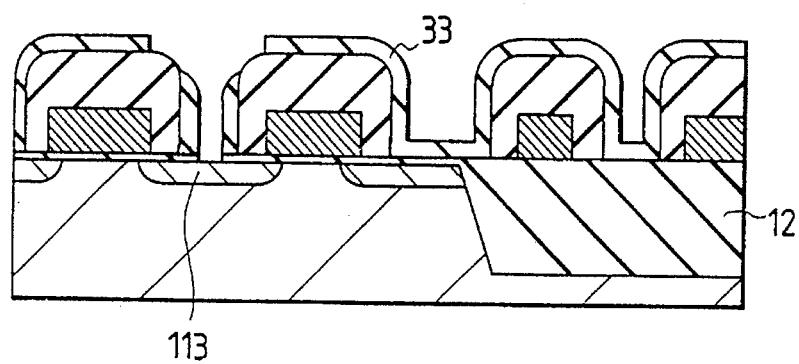
Figure 18E:
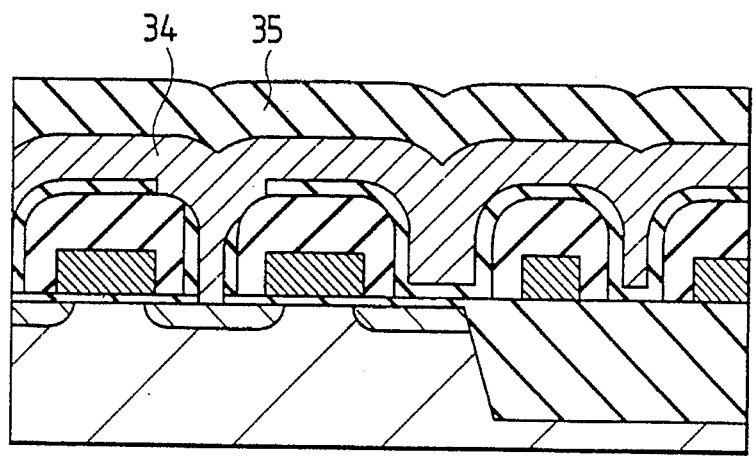
Figure 18F:
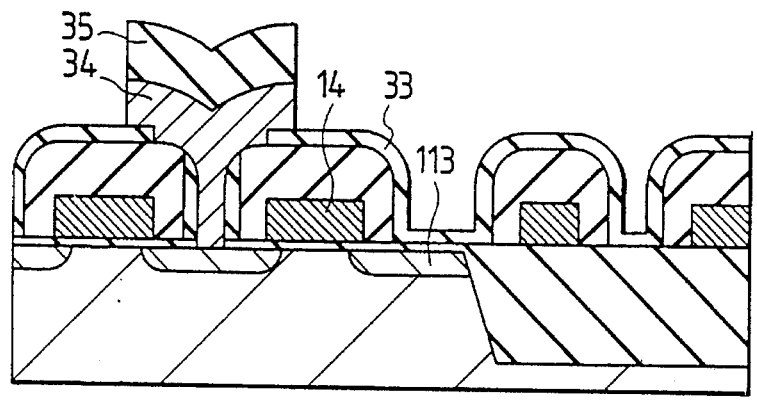
Figure 18G:
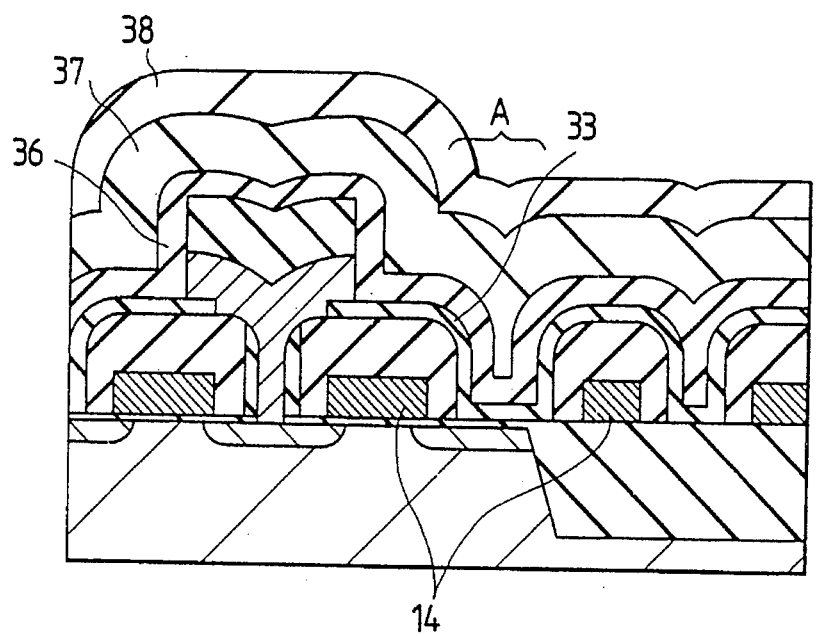

The n$^+$ diffusion layer is formed by ion implantation while using the word line 14 as a mask, as shown in FIG. 18c. An SiO$_2$ film having a thickness of 100 nm is next deposited by CVD and delineated by anisotropic dry etching so as to form an SiO$_2$ film 32 on the side wall of the word line. Thereafter, an SiO$_2$ film 33 having a thickness of 50 nm is formed by CVD. The region at which a bit line is to be brought into contact with the diffusion layer is delineated by anisotropic dry etching while using a resist pattern (not shown) as a mask, thereby exposing the desired portion of the n$^+$ diffusion layer 113, as shown in FIG. 18d. Polycrystalline Si 34 doped with phosphorus at a dosage of about $10^{20}$ cm$^{-3}$ and an SiO$_2$ film 35 are deposited by CVD, as shown in FIG. 18e. The SiO$_2$ film 35 and the polycrystalline Si film 34 are delineated employing a resist pattern (not shown) as a mask so as to form a bit line covered with the SiO$_2$ film 35, as shown in FIG. 18f. An SiO$_2$ film 36 having a thickness of a 100 nm, an Si$_3$N$_4$ film 37 having a thickness of 200 nm and an SiO$_2$ film 38 having a thickness of 150 nm are deposited by CVD. At this time, care must be taken not to fill up the region A (the region at which the charge storage electrode is to be brought into contact with the n$^+$ diffusion layer) in FIG. 18g with the SiO$_2$ film 36. In this embodiment which assumes to be a DRAM of 64 mega-bits, the thickness of the $SiO_2$ film 36 should be not more than 200 nm. The $Si_3N_4$ 37 is required to have a thickness of not less than about 100 nm in order to substantially completely fill up the region A and make the surface thereof flat. In this embodiment, the thickness of the $Si_3N_4$ 37 is not less than 100 nm. The thickness of the last deposited $SiO_2$ film 38 is set such that the total thicknesses of the already deposited $SiO_2$ film 36 and $Si_3N_4$ film 37 and the thickness of the $SiO_2$ film 38 is equivalent to the height of the wall-like charge storage electrode or the value with a slight margin added thereto, The $SiO_2$ film 38, the $Si_3N_4$ film 37, $SiO_2$ film 36 and the $SiO_2$ film 33 are then anisotroprically dry etched while using a resist pattern (not shown) as a mask so as to expose the substrate at the region A. At this moment, as is obvious from FIG. 18g, the $Si_3N_4$ film 37 is buried in the portion A, i.e. in the gap of the word lines 14, so that the substantial thickness for etching is large. For this reason, an $Si_3N_4$ etching technique having a selection ratio with respect to the underlayer $SiO_2$ 33 is necessary. To state this more concretely, a plasma etching technique using a plasma such as $CF_3+O_2$, $CH_2F_2$, $CHF_3$, $CH_3F$ and $CH_4+F_2$ is preferable for etching of the $Si_3N_4$ film. In the case of using these gases, the etching speed of $Si_3N_4$ is about 10 times higher than that of $SiO_2$, so that it is possible to delineate the $Si_3N_4$ film 37 substantially without damaging (scraping) the underlayer $SiO_2$ film 33.

Figure 18H:
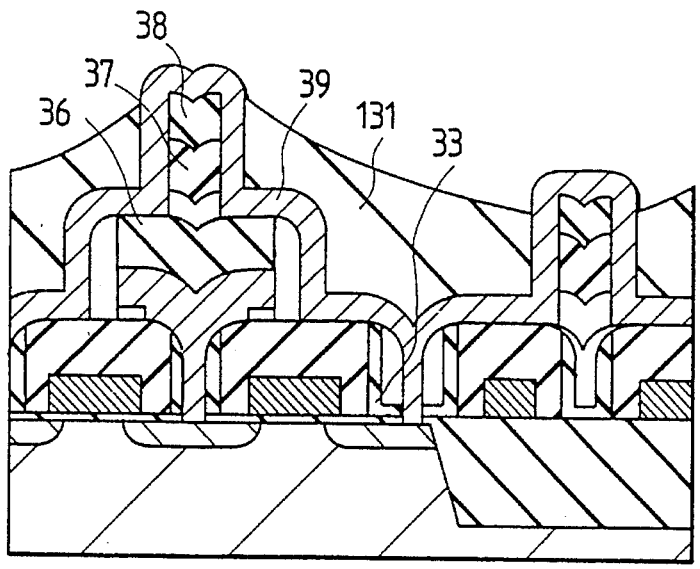
Figure 18I:
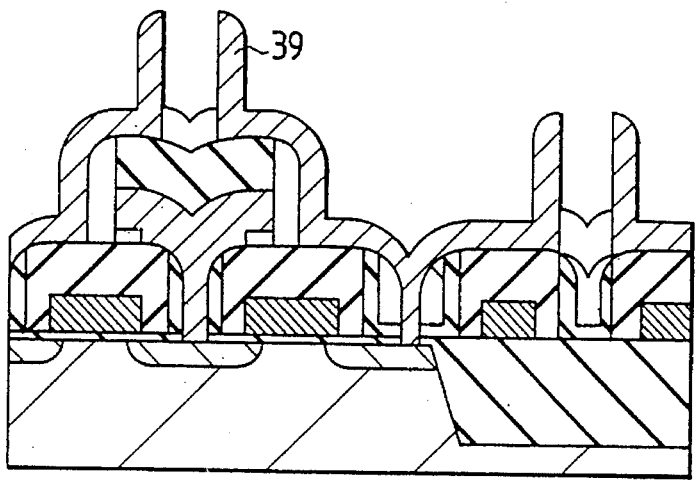
Figure 18J:
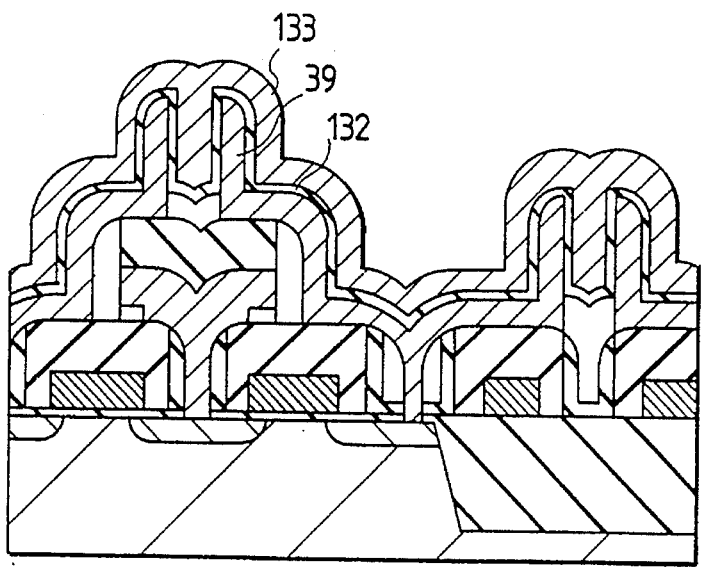

After the delineation of these films, a polycrystalline Si film 39 doped with phosphorus at a dosage of about $10^{20}$ $cm^{-3}$ is deposited by CVD. The thickness of the polycrystalline Si film 39 is 100 nm and is so determined that the film 39 does not completely fill up the recessed portions of the $SiO_2$ film 36, the $Si_3N_4$ film 37 and the $SiO_2$ film 38. A resist 1 μm in thickness is then applied and buried a resist 131 in the recessed portions, as shown in FIG. 18h, by etching the resist film to a depth more than 1 μm, which is the thickness of the resist film. The polycrystalline Si film 39 is then anisotropically dry etched to a depth of slightly more than the thickness of the polycrystalline Si film 39. The $SiO_2$ film 38 is then etched with an aqueous HF solution and the $Si_3N_4$ film 37 is etched with an aqueous solution of phosphoric acid. If the temperature of the phosphoric acid is set at about 160° to 180° C., the $Si_3N_4$ film 37 of about 100 nm in thickness is etched in several minutes to several ten minutes, as shown in FIG. 18i. A capacitor insulating film 132 and a plate electrode 133 are finally formed, as shown in FIG. 18j. Although $SiO_2$ is used for the capacitor insulating film in this embodiment, an insulating film of $Ta_2O_5$, $Si_3N_4$ or the like or a composite film thereof is naturally usable. $KNO_3$ and other ferroelectric materials are also usable. Polycrstalline Si doped with phosphorus is used for the plate electrode 133 in this embodiment, but W, Mo, $WSi_2$, $MoSi_2$ and other metal materials and metal silicide materials may also be used.

Embodiment 12

Figure 19:
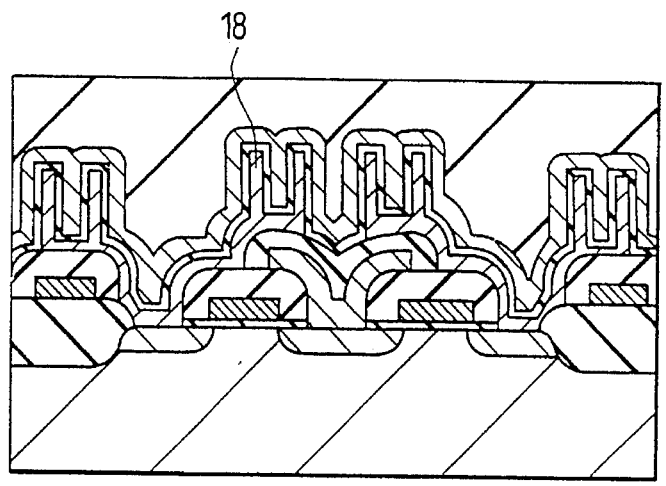
FIG. 19 is a sectional view of a memory cell according to a twelfth embodiment of the present invention.

The embodiment shown in FIG. 19 has the wall-like charge storage electrode 18 having the double wall portions formed concentrically. This structure enables the storage capacity to be increased by about 50% as compared with the embodiment 11 shown in FIG. 16.

Figure 20A:
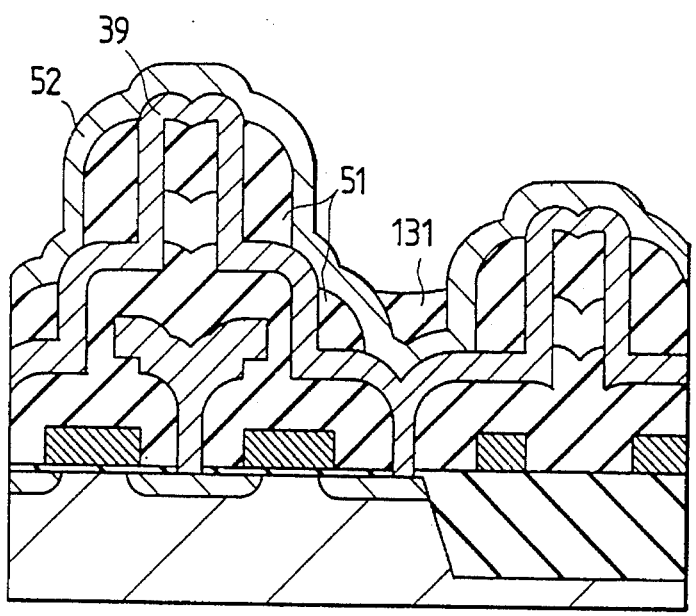
FIGS. 20a and 20b are sectional views illustrating the steps of fabricating a memory cell according to the twelfth embodiment of the present invention shown in FIG. 19.
Figure 20B:
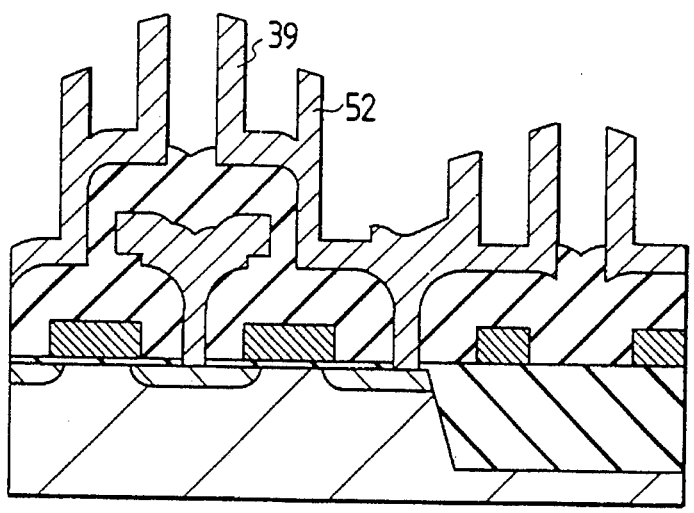

FIGS. 20a and 20b show the process for fabricating a semiconductor device of this embodiment. Completion of the steps shown in FIG. 18a to 18g prior to the step shown in FIG. 20a facilitates the fabricating process of this embodiment. After the step shown in FIG. 18g, the $SiO_2$ film 38, the $Si_3N_4$ film 37 and the $SiO_2$ film 36 are anisotroprically dry etched and the polycrystalline Si film 39 doped with phosphorus at a dosage of about $10^{20}$ $cm^{-3}$ is deposited by CVD. The thickness of the polycrystalline Si film 39 is 50 nm. An $SiO_2$ film 51 having a thickness of 80 nm is then deposited by CVD and further anisotropically dry etched so as to leave $SiO_2$ on the recessed inner wall. A polycrystalline Si film 52 doped with phosphorus at a dosage of about $10^{20}$ $cm^{-3}$ is next deposited by CVD to a thickness of 50 nm, as shown in FIG. 20a. The polycrystalline Si film 52 and the polycrystalline Si film 39 are anisotropically dry etched. The amount of etching polycrystalline Si is not less than 100 nm. The amount α of over-etching exceeding 100 nm is so determined that the polycrystalline Si films remaining at the adjacent recessed portions do not cause short-circuit, as shown in FIG. 20b, from a simple experiment, if necessary. The reference numeral 131 denotes a resist.

Thereafter, a capacitor insulating film and a plate electrode are formed, thereby completing the structure equivalent to the embodiment 12 shown in FIG. 19.

In this embodiment, the double concentric wall is formed. By repeating the deposition and dry etching of $SiO_2$ and the deposition of polycrystalline Si as shown in FIGS. 20a and 20b, it is possible to form a triple or a quadruple wall on principle. In this case, it is necessary to make the thickness of each film thin so as not to completely fill up the recessed portion.

Figure 21:
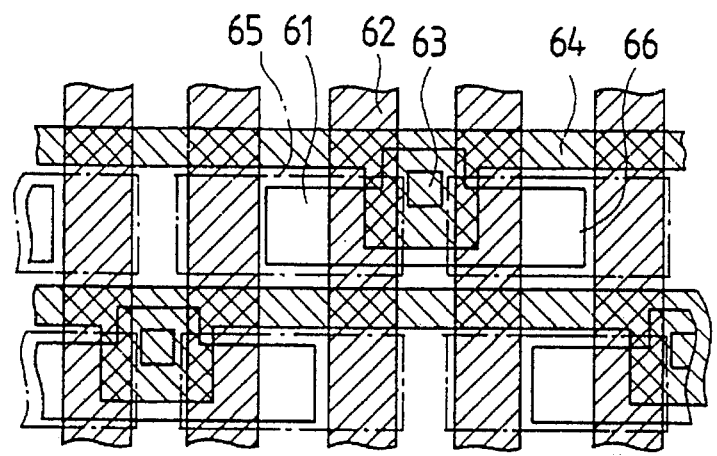
FIG. 21 is a plan view of an example of a layout of a memory cell according to the present invention.

FIG. 21 shows an example of a layout of a semiconductor device according to the present invention. In the embodiment 11 and the embodiment 12 shown in FIGS. 16 and 19, since the bit line 16 is formed prior to the formation of the charge storage electrode, the wiring portion of the bit line 16 must be kept out of the portion at which the charge storage electrode comes into contact with the substrate. Therefore, in this embodiment, the bit line is formed above the memory cell region (above in FIG. 21). In this embodiment, the layout pattern for forming a charge storage electrode 65 is shown by a hole pattern (a pattern of region the inside thereof is to be etched).

In FIG. 21, the reference numeral 61 denotes an active region, 62 a gate electrode (word line), 63 a contact hole for a bit line, 64 a bit line and 66 the portion at which the charge storage electrode 65 comes into contact with the substrate.

At the actual fabrication, a hole pattern is generally apt to be enlarged, so that the distance between the adjacent hole patterns is reduced at the time of completion. On principle, it is impossible to make the distance between the hole patterns not more than the limitation of resolution of the lithography technique, but by utilizing the above-described hole pattern enlarging phenomenon, it is possible to substantially reduce the distance between the hole patterns and to enlarge the hole pattern and, hence, the charge storage electrode formed in the hole to that degree.

It goes without saying that the memory cells having the wall-like charge storage electrode shown in FIG. 16 and 19 are applicable to the structure of the layout shown in FIG. 1.

In the layouts shown in FIGS. 21 and 1, the etching mask for the insulating film for bringing the charge storage electrode into contact with the substrate is used as the mask for forming the charge storage electrode as it is. It is one of the characteristics of the present invention that the mask pattern and the masking step are simplified in comparison with the prior art which requires separate mask patterns and masking steps.

Embodiment 13

Figure 22:
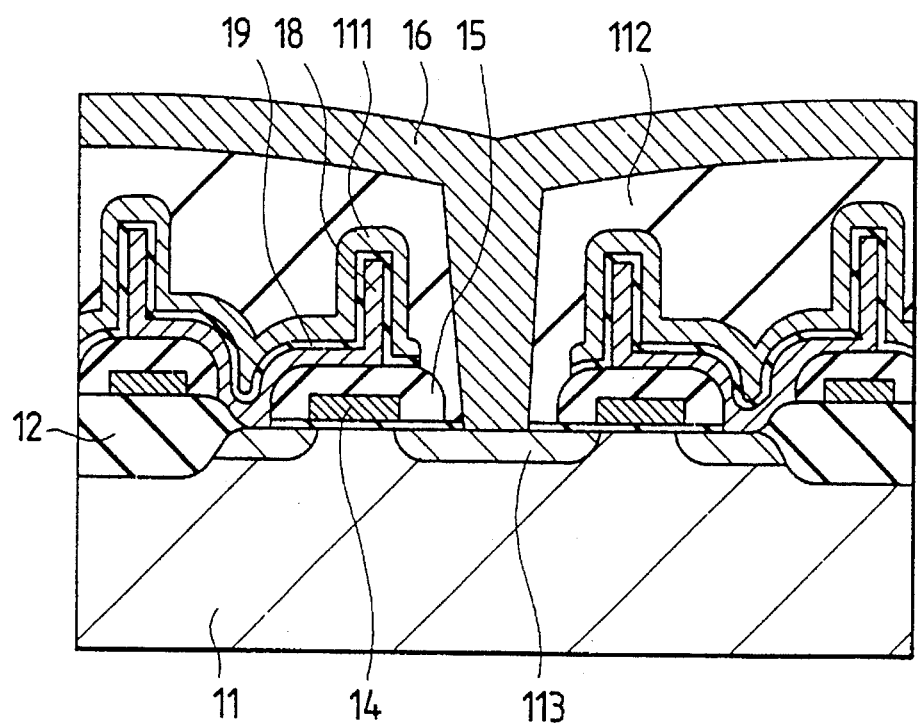
FIG. 22 is a sectional view of a memory cell according to a thirteenth embodiment of the present invention.

FIG. 22 shows an embodiment in which the bit line 16 is formed after the formation of the charge storage electrode 18. The wall-like charge storage electrode 18 can be formed without any problem even if the bit line 16 is formed thereafter.

In FIG. 22, the reference numeral 11 represents the Si substrate, 12 the element isolating film, 14 a word line, 15 the interlayer insulating film, 19 the capacitor insulating film, 111 the plate electrode, 112 the interlayer insulating film, and 113 the impurity diffusion layer.

In the above-described embodiment, the n-channel type memory cell is formed, but the present invention is naturally applicable to a p-channel type memory cell.

The present invention can be, needless to say, applicable to both the folded bit line type and the open bit line type memory array.

It goes without saying that by adopting this embodiment only for the formation of a capacitor, it is possible to form a capacitor having a larger storage capacity without increasing the area of the capacitor.

The structure of the memory cell having the above-described wall-like charge storage electrode is applicable to the Embodiments 1 to 10, and is also applicable to any semiconductor memory device having a charge storage capacitor on principle.

As described above, according to the semiconductor memory device of the present invention which has a switching transistor and a charge storage capacitor as a minimal unit, since the major portion of an active region in which a channel region and source and drain regions of the switching transistor are formed is so arranged as not to be parallel to neither the major portion of a word line constituting the switching transistor nor the major portion of a bit line for writing and reading data, fine memory cells required for the DRAM's of the level of 16 mega-bits can be easily fabricated based on the conventional photolithograph method and dry etching method. Compared with the STC cells of the conventional structure, furthermore, the storage capacities are not affected by the delineation of plate electrode; i.e., the storage capacity portions can be arranged most densely. Accordingly, a sufficiently large capacity is obtained even with a very small cell area. According to the third embodiment, furthermore, the capacity can be increased by 20 to 30% which is large enough to cope with soft errors caused by alpha particles and circuit noise.

The second feature of the present invention resides in that since the storage capacity portions are formed on the bit lines, the storage capacities and the plate electrode work as shielding lines for the bit lines. Therefore, the interline capacity of the bit lines decreases and the memory array noise decreases greatly, too. A further great feature resides in that the number of masks for realizing the above-mentioned structure is nearly the same as that of the conventional structure.

In addition, a semiconductor memory device and a process for fabricating the same according to the present invention is a semiconductor memory device of one-transistor and one-capacitor type semiconductor device having a charge storage electrode which extends on a word line or a bit line and a process for fabricating the same. Since the periphery portion of the charge storage electrode region has a configuration of a thin wall, and the inner wallsurface and the outer wall surface thereof constitute the charge storage electrode, it is possible to form a storage capacity portion having a larger capacity than a conventional semiconductor device in a fine cell area. Consequently, it is possible to form a memory having a high degree of integration. A capacitor having such a wall-like charge storage electrode can be incorporated into an LSI and other semiconductor devices which are mainly used for logical operation.

In addition, since it is possible to reduce the number of times for using a mask pattern by one as compared with the prior art, the present invention can advantageously shorten the time for fabrication.

As mentioned above, the present invention makes it possible to realize the memory cells satisfying areas and capacities required for the DRAM's of the level of several mega-bits to several tens of mega-bits.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. A semiconductor memory device having a plurality of word lines formed by a first level wiring layer covering a surface of a semiconductor substrate, a plurality of bit lines formed by a second level wiring layer covering said first level wiring layer and a plurality of dynamic memory cells whose storage electrodes of capacitors are formed by a third level wiring layer coveting said second level wiring layer, comprising:

first, second, third and fourth word lines of said plurality of word lines, which are successively disposed;

first, second and third bit lines of said plurality of bit lines, which are successively disposed;

a first dynamic memory cell of said plurality of dynamic memory cells, of which a storage electrode of a capacitor is coupled to a source or a drain of a MOS transistor of said first dynamic memory cell through a first capacitor contact hole;

a second dynamic memory cell of said plurality of dynamic memory cells, of which a storage electrode of a capacitor is coupled to a source or a drain of a MOS transistor of said second dynamic memory cell through a second capacitor contact hole;

a third dynamic memory cell of said plurality of dynamic memory cells, of which a storage electrode of a capacitor is coupled to a source or a drain of a MOS transistor of said third dynamic memory cell through a third capacitor contact hole; and, a fourth dynamic memory cell of said plurality of dynamic memory cells, of which a storage electrode of a capacitor is coupled to a source or a drain of a MOS transistor of said fourth dynamic memory cell through a fourth capacitor contact hole, wherein said second bit line is coupled to the drains or sources of transistors of two of said first, second, third and fourth dynamic memory cells through a second bit line contact hole which is between said second word line and said third word line;

wherein said first capacitor contact hole is between said first word line and said second word line, and between said first bit line and said second bit line, wherein said second capacitor contact hole is between said third word line and said fourth word line, and between said first bit line and said second bit line, wherein said third capacitor contact hole is between said first word line and said second word line, and between said second bit line and said third bit line, wherein said fourth capacitor contact hole is between said third word line and said fourth word line, and between said second bit line and said third bit line, wherein said second bit line is disposed in a longitudinal direction over said first, second, third and fourth word lines, wherein a major portion of the second bit line comprises a straight line portion parallel to the longitudinal direction of said second bit line and said second bit line is coupled to drains or sources of transistors of said third and fourth dynamic memory cells through said second bit line contact hole; and, wherein said second bit line contact hole overlaps said straight line portion of said major portion of said second bit line.

2. The semiconductor memory device according to claim 1, further comprising a fifth word line next to said fourth word line, wherein said second bit line is coupled to drain or source of a transistor of said second dynamic memory cell through an other second bit line contact hole which is between said fourth word line and said fifth word line.

3. The semiconductor memory device according to claim 1, further comprising a fifth word line next to said fourth word line, wherein said first bit line is coupled to drain or source of a transistor of said second dynamic memory cell through a first bit line contact hole which is between said fourth word line and said fifth word line.

4. A semiconductor memory device having a plurality of word lines formed by a first level wiring layer covering a surface of a semiconductor substrate, a plurality of bit lines formed by a second level wiring layer covering said first level wiring layer and a plurality of dynamic memory cells whose storage electrodes of capacitors are formed by a third level wiring layer covering said second level wiring layer, comprising:

first, second, third and fourth word lines of said plurality of word lines, which are successively disposed;

first, second and third bit lines of said plurality of bit lines, which are successively disposed;

a first dynamic memory cell of said plurality of dynamic memory cells, of which a storage electrode of a capacitor is coupled to a source or a drain of a MOS transistor of said first dynamic memory cell through a first capacitor contact hole;

a second dynamic memory cell of said plurality of dynamic memory cells, of which a storage electrode of a capacitor is coupled to a source or a drain of a MOS transistor of said second dynamic memory cell through a second capacitor contact hole;

a third dynamic memory cell of said plurality of dynamic memory cells, of which a storage electrode of a capacitor is coupled to a source or a drain of a MOS transistor of said third dynamic memory cell through a third capacitor contact hole; and, a fourth dynamic memory cell of said plurality of dynamic memory cells, of which a storage electrode of a capacitor is coupled to a source or a drain of a MOS transistor of said fourth dynamic memory cell through fourth capacitor contact hole, wherein said second bit line is coupled to the drains or sources of transistors of two of said first, second, third and fourth dynamic memory cells through a second bit line contact hole which is between said second word line and said third word line;

wherein said first capacitor contact hole is between said first word line and said second word line, and between said first bit line and said second bit line, wherein said second capacitor contact hole is between said third word line and said fourth word line, and between said first bit line and said second bit line, wherein said third capacitor contact hole is between said first word line and said second word line, and between said second bit line and said third bit line, wherein said fourth capacitor contact hole is between said third word line and said fourth word line, and between said second bit line and said third bit line, wherein said second bit line is disposed in a longitudinal direction over said first, second, third and fourth word lines, wherein a major portion of the second bit line comprises a straight line portion parallel to the longitudinal direction of said second bit line, and a minor portion of the second bit line comprises a projection portion extending perpendicular to the major portion; and, wherein said second bit line contact hole overlaps said straight line portion of said major portion of said second bit line and is coupled to drains or sources of transistors of said third and fourth dynamic memory cells through said second bit line contact hole.

5. The semiconductor memory device according to claim 4, further comprising a fifth word line next to said fourth word line, wherein said second bit line is coupled to a drain or source of a transistor of said second dynamic memory cell through an other second bit line contact hole which is between said fourth word line and said fifth word line.

6. The semiconductor memory device according to claim 4, further comprising a fifth word line next to said fourth word line, wherein said first bit line is coupled to a drain or source of a transistor of said second dynamic memory cell through a first bit line contact hole which is between said fourth word line and said fifth word line.

7. The semiconductor memory device according to claim 4, wherein said projection extends in a first direction towards the first bit line.

8. The semiconductor memory device according to claim 4, wherein said projection extends in a second direction towards the third bit line.

9. The semiconductor memory device according to claim 4, wherein said projection extends in a first direction towards the first bit line and in a second direction towards the third bit line.

10. The semiconductor memory device according to claim 4, wherein said second bit line contact hole has an extent in a direction perpendicular to the longitudinal direction of the second bit line substantially equivalent to the major portion of the bit line.

11. The semiconductor memory device according to claim 4, wherein said second bit line contact hole has a dimension sized to completely overlap the major portion of the second bit line in a direction perpendicular to the longitudinal direction of the second bit line.

12. In a memory cell device comprising active regions where channel regions and impurity diffusion layers are formed on a semiconductor substrate to constitute transistors, wherein word lines serve as gate electrodes and bit lines are substantially orthogonal to the word lines and have bit line contact holes through which the bit lines come into contact with the impurity diffusion layers formed on the substrate, conductive layers for connecting the bit lines with the impurity diffusion layers, and electrode contact holes for connecting charge storage electrodes to the substrate, the improvement comprising:

a plurality of memory cells, each having an electrode contact hole associated respectively with a charge storage electrode, wherein each charge storage electrode is bounded on opposite sides by two of the bit lines and two of the word lines and wherein the bit line contact holes substantially overlap the bit lines and are bounded by two of the word lines, and a selected two of the memory cells are disposed between an adjacent two of the bit lines; and, wherein a one of the adjacent two of the bit lines is coupled to drains or sources of the electrode contact holes for the selected two of the memory cells.

* * * * *